United States Patent

Koga et al.

[11] Patent Number: 5,909,461
[45] Date of Patent: Jun. 1, 1999

[54] SPREAD SPECTRUM COMMUNICATION APPARATUS AND DEMODULATOR SURFACE ACOUSTIC WAVE ELEMENT AND SURFACE ACOUSTIC WAVE PARTS FOR SPREAD SPECTRUM COMMUNICATION

[75] Inventors: Naoki Koga, Fukuoka-ken; Masatoshi Ohtsuka, Fukuoka; Seishi Tomari, Onojo, all of Japan

[73] Assignee: Matsushita Electric Industrial Co., Ltd., Osaka, Japan

[21] Appl. No.: 08/677,957

[22] Filed: Jul. 10, 1996

[30] Foreign Application Priority Data

| Jul. 10, 1995 | [JP] | Japan | 7-173140 |
| Dec. 22, 1995 | [JP] | Japan | 7-334564 |
| Dec. 28, 1995 | [JP] | Japan | 7-342787 |

[51] Int. Cl.$^6$ .............................. H04B 1/707; H03H 9/00
[52] U.S. Cl. ..................... 375/206; 375/207; 375/208; 333/193
[58] Field of Search ..................... 375/200, 206, 375/207, 208, 209, 210, 343; 333/150, 193, 195, 196

[56] References Cited

U.S. PATENT DOCUMENTS

| 4,164,628 | 8/1979 | Ward et al. | 375/208 |
| 5,187,718 | 2/1993 | Takehara | 375/343 |
| 5,189,330 | 2/1993 | Niitsuma | 310/313 B |
| 5,353,304 | 10/1994 | Mochizuki | 375/200 |
| 5,355,389 | 10/1994 | O'Clock et al. | 375/200 |
| 5,365,516 | 11/1994 | Jandrell | 370/335 |
| 5,434,893 | 7/1995 | Le Roy et al. | 375/208 |
| 5,467,367 | 11/1995 | Izumi et al. | 375/206 |

FOREIGN PATENT DOCUMENTS

| 0 553 626 | 10/1976 | United Kingdom . |
| 1 560 474 | 2/1980 | United Kingdom . |
| 2 029 148 | 3/1980 | United Kingdom . |
| 2 306 821 | 5/1997 | United Kingdom . |

OTHER PUBLICATIONS

Eigler, Hans, Mikroelektronische Filter, Berlin, Verlag Technik GmbH, 1990, pp. 258–274.

Haykin, Simon, Digital Communications; New York, John Wiley & Sons, 1988, pp. 445–473.

Primary Examiner—Stephen Chin
Assistant Examiner—Jeffrey W. Gluck
Attorney, Agent, or Firm—Venable; Robert J. Frank; Allen Wood

[57] ABSTRACT

A spread spectrum communication apparatus includes at least one surface acoustic wave matched filter, a plurality of surface acoustic wave delay lines having different delay amounts, and integrating circuits for integrating an output signal of the surface acoustic wave matched filter and the respective output signals of the plurality of surface acoustic wave delay lines.

27 Claims, 23 Drawing Sheets

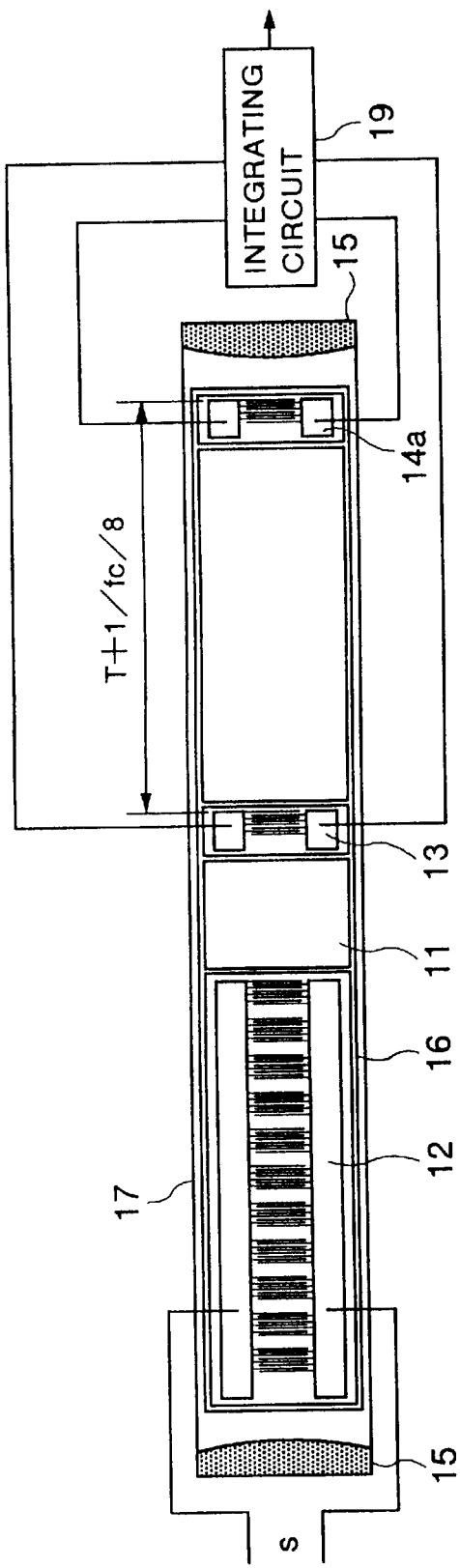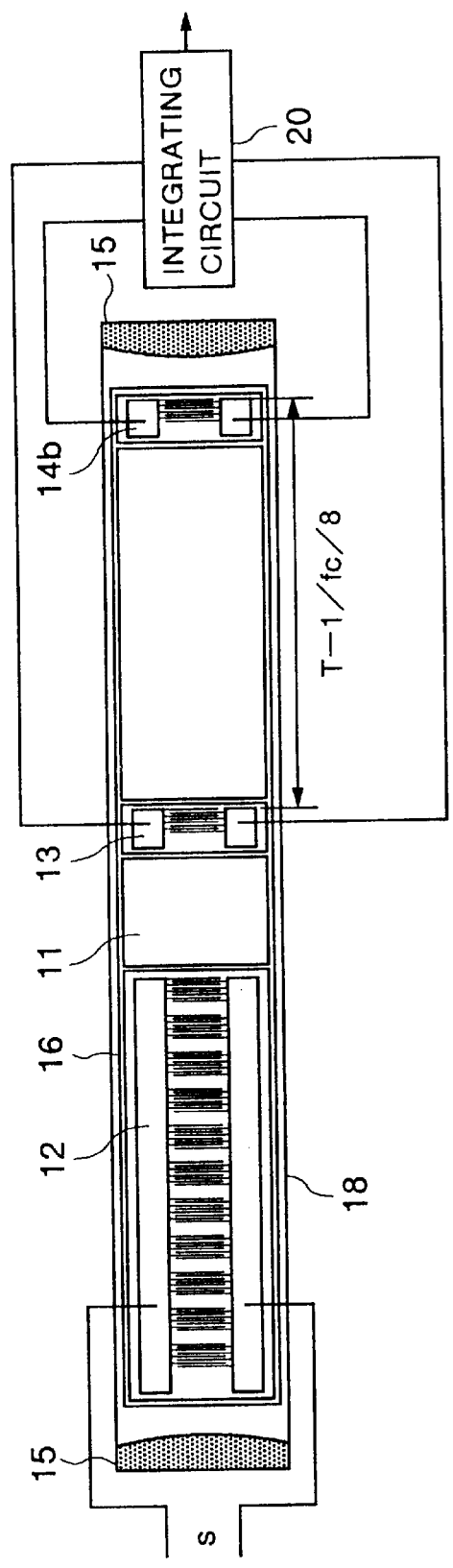

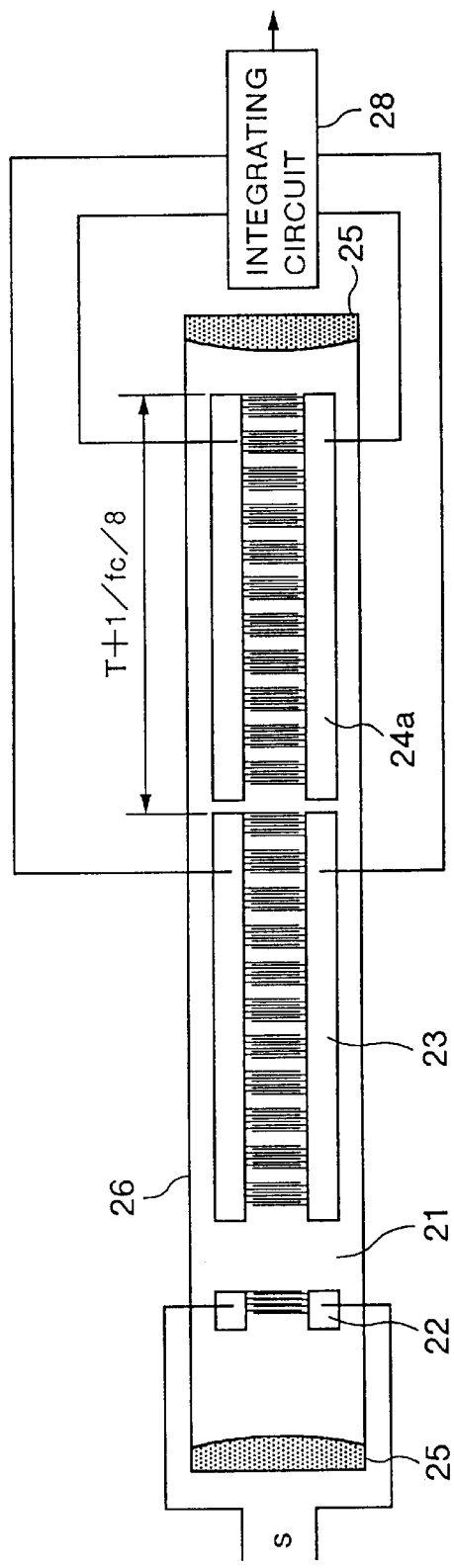
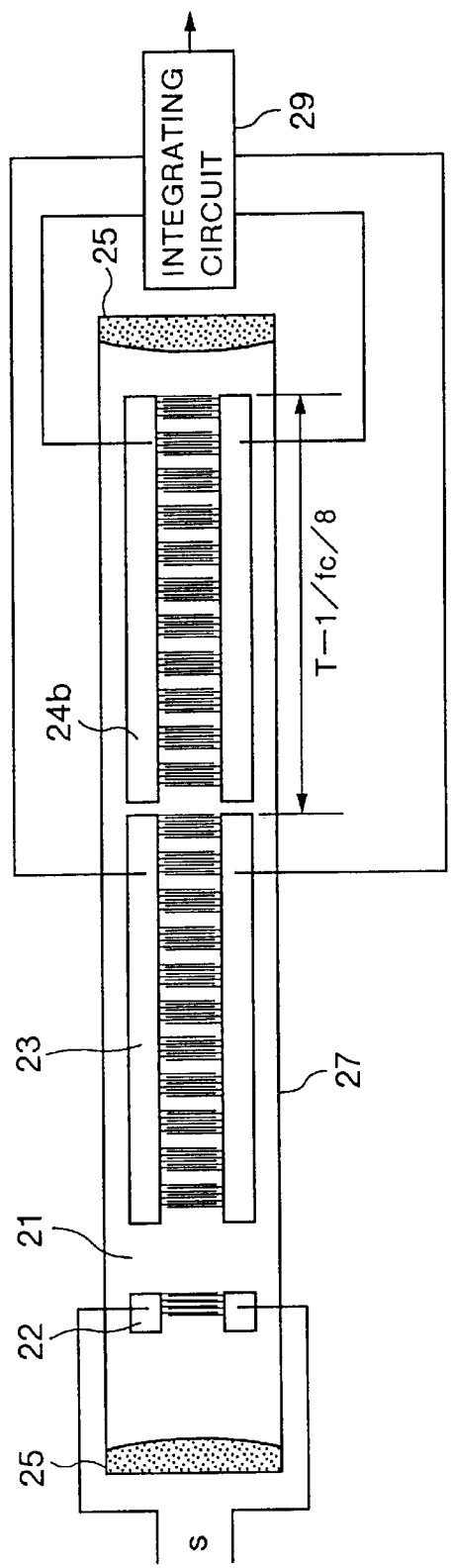

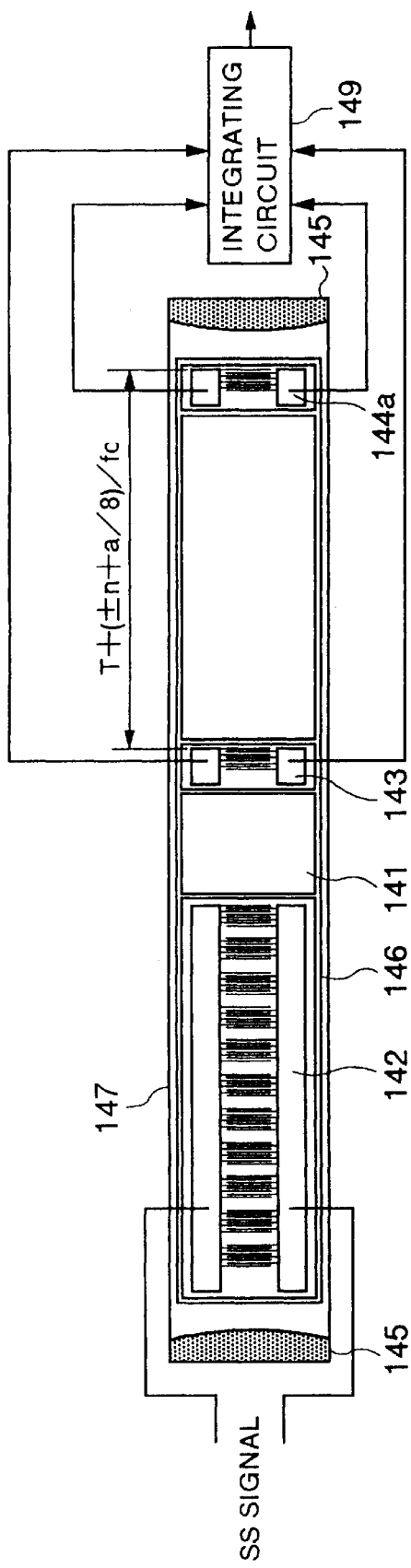
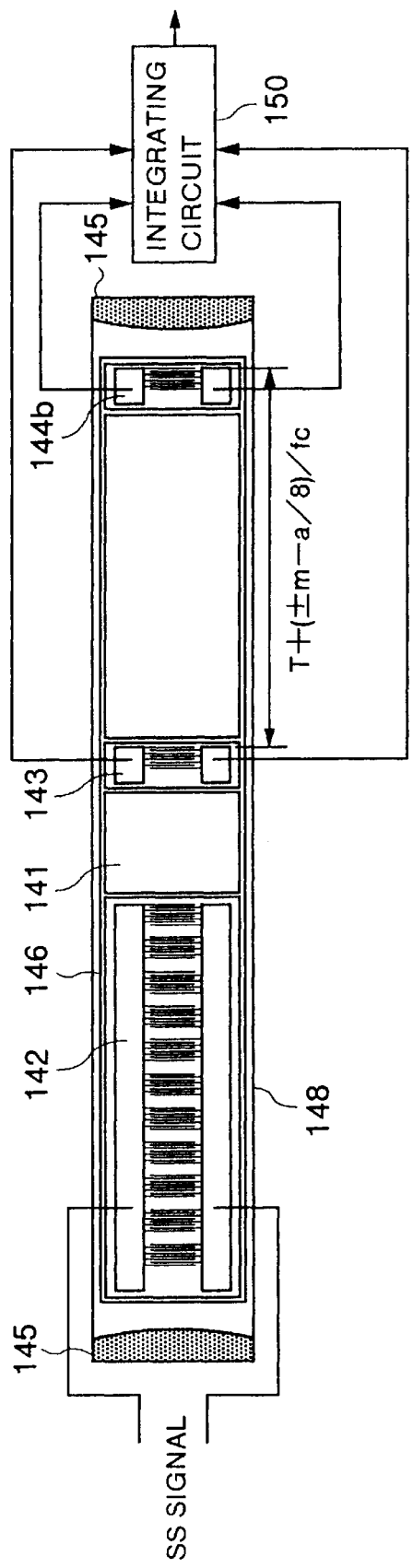

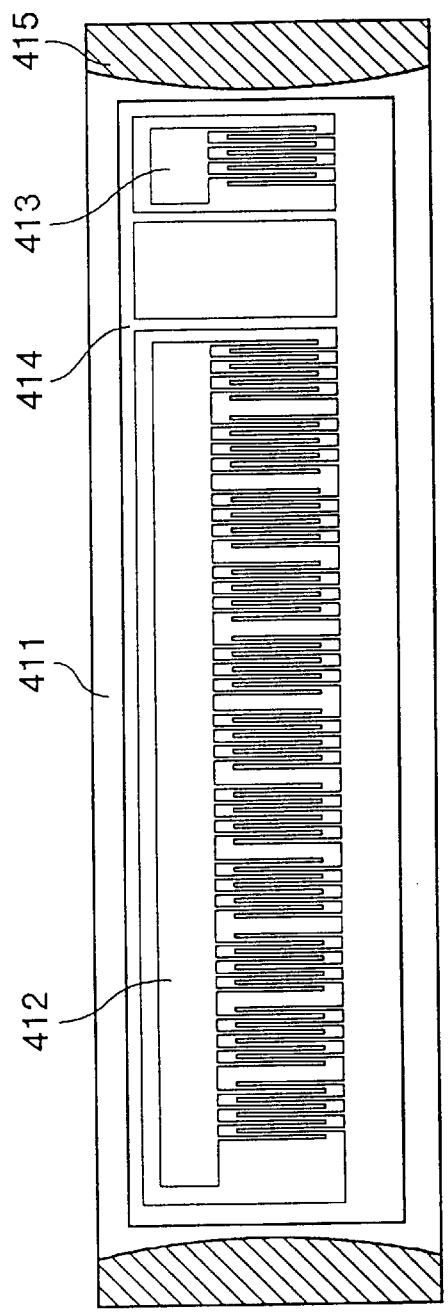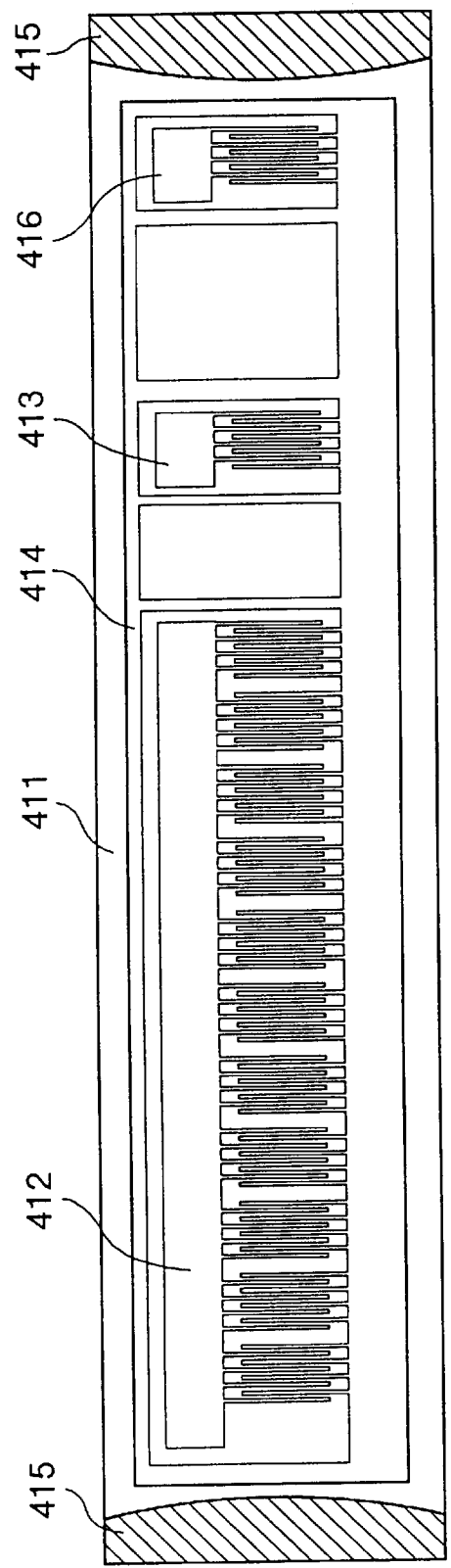

5,909,461

SPREAD SPECTRUM COMMUNICATION APPARATUS AND DEMODULATOR SURFACE ACOUSTIC WAVE ELEMENT AND SURFACE ACOUSTIC WAVE PARTS FOR SPREAD SPECTRUM COMMUNICATION

BACKGROUND OF THE INVENTION

The present invention relates to a spread spectrum communication apparatus used in a spread spectrum communication system, a demodulator used in the communication apparatus, a surface acoustic wave element used in the demodulator, and surface acoustic wave parts used in the demodulator.

In recent years, a spread spectrum communication system (SS communication system) having strong noise resistivity and excellent secrecy and concealability has receive attention as a communication system for civil use. In the SS communication system, carrier waves obtained by modulating information to be transmitted by a carrier signal are subjected to spread spectrum modulation (SS modulation) by use of a predetermined code series having a high chip rate to obtain a spread spectrum signal (SS signal) which is transmitted as a transmit signal. In this case, the code series may include a pseudo noise code series (PN code series) and a Barker code series. The SS modulation system may include a direct spread system (DS system) and a frequency hopping system (FH system).

In such an SS communication system, the receiver side requires a demodulator for demodulating the SS signal transmitted thereto. For example, in the case where the SS modulation is base on the DS system by use of the PN code series, the receiver side uses the same PN code series as that on the transmitter side for demodulation. At this time demodulators are roughly divided into demodulators using IC and demodulators using surface acoustic wave elements. A surface acoustic wave element used in a demodulator has become an object of attention since the demodulator can be fabricated at a low cost and with a simple construction by using a photolithography technique for formation of the surface acoustic wave element.

Surface acoustic wave elements can be classified into surface acoustic wave matched filters and surface acoustic wave convolvers from the structural aspect. In the surface acoustic wave convolver, it is possible to select a PN code series which is used for modulation. Therefore, the surface acoustic wave convolver is suitable for use in applications in which secrecy and concealability are especially required. In the surface acoustic wave matched filter, a PN code series used for modulation is fixed but a peripheral circuit can correspondingly be formed with a simple construction, thereby providing the whole system at a low cost. Therefore, the surface acoustic wave matched filter has become an object of attention as a demodulator used in a small-scale SS communication system, for example, a private wireless LAN.

The construction of a conventional demodulator for a DS system using a surface acoustic wave matched filter is shown by FIG. 11 in block diagram. In the figure, reference numeral 61 denotes a surface acoustic wave matched filter inputted with an SS signal s for outputting a correlation signal m, numeral 62 denotes a surface acoustic wave delay line for delaying the correlation signal m from the surface acoustic wave matched filter 61 by one period, numeral 63 denotes an integrating circuit for integrating the correlation signal m from the surface acoustic wave matched filter 61 and a correlation signal n from the surface acoustic wave delay line 62 subjected to the delay of one period, numeral 64 denotes an amplifier for amplifying the correlation signal m from the surface acoustic wave matched filter 61, and the symbols L1 and L2 denote signal lines.

The operation of the demodulator shown in FIG. 11 will now be explained briefly. An SS signal s inputted to the surface acoustic wave matched filter 61 is converted by the surface acoustic wave matched filter 61 into a correlation signal m which is in turn divided into two systems including the lines L1 and L2. The correlation signal m on the line L1 is inputted directly to the integrating circuit 63. The correlation signal m on the other line L2 is inputted to the surface acoustic wave delay line 62 through the amplifier 64 so that it is inputted to the integrating circuit 63 as a correlation signal n delayed by one period. The integrating circuit 63 integrates the correlation signal m and the one-period delayed signal n to obtain a demodulated signal.

FIG. 12A is a pattern diagram showing the surface acoustic wave matched filter in the demodulator shown in FIG. 11. In FIG. 12A, reference numeral 71 denotes a piezoelectric substrate made of quartz crystal, $LiNbO_3$ or the like, numeral 72 denotes a signal input electrode, numeral 73 denotes an output encoding electrode, and numeral 74 denotes an acoustic material member for absorbing unnecessary surface acoustic waves. Next, an explanation of operation will be made. The signal input electrode 72 has a comb form for converting an electric signal into surface acoustic waves. The output encoding electrode 73 is separated from the electrode 72 by a predetermined interval and converts the surface acoustic waves into an electric signal. The electrodes 72 and 73 are provided on the piezoelectric substrate 71 to form a surface acoustic wave matched filter. In the case where a PN code series of n bits is used, the output encoding electrode 73 has n comb-like electrode pairs corresponding to the n-bit PN code series and the comb-like electrode pairs are formed at intervals corresponding to the chip rate. In this case, the number of pairs of electrodes (or electrode fingers) in a comb-like electrode pair is 1 (one). For the purpose of absorbing unnecessary surface acoustic waves, the acoustic material members 74 are formed outside of the input and output electrodes 72 and 73, as required. In this case, the signal input electrode 72 and the output encoding electrode 73 may be reversed, that is, the signal input electrode 72 and the output encoding electrode 73 may be used as an output electrode and an input electrode, respectively.

FIG. 12B is a pattern diagram showing the surface acoustic wave delay line in the demodulator shown in FIG. 11. In FIG. 12B, reference numeral 75 denotes a piezoelectric substrate made of quartz crystal, $LiNbO_3$ or the like, numeral 76 denotes a signal input electrode, numeral 77 denotes a signal output electrode, and numeral 78 denotes acoustic material members for absorbing unnecessary surface acoustic waves. Next, an explanation of operation will be made. The signal input electrode 76 has a comb form for converting an electric signal into surface acoustic waves. The signal output electrode 77 also has a comb form separated from and is the electrode 76 by an interval corresponding to one period T of a signal to be received and demodulated. The electrode 77 converts the surface acoustic waves into an electric signal. The electrodes 76 and 77 are provided on the piezoelectric substrate 75 to form a surface acoustic wave delay line. For the purpose of absorbing unnecessary surface acoustic waves, the acoustic material members 74 are formed outside of the input and output electrodes 76 and 77, as required.

A demodulator using such a surface acoustic wave matched filter performs demodulation by use of two polarities (for example, 0 phase and π phase) which the surface acoustic wave matched filter takes. The modulation system corresponds to binary phase shift keying system (BPSK system).

Though the transmission rate of information in a wireless LAN or the like is as high as possible, the transmission rate in an SS communication is restricted by the band width of the SS communication system itself and the PN code series that is used. Namely, it is required that the transmission rate should be lower than a value obtained by dividing the band width by 2n, wherein n is the number of bits in the PN code series. From the aspect of transmission rate, therefore, it is preferable that the number of bits in the PN code series is made small. However, if the number of bits in the PN code series is too small, there is an inconvenience in that the secrecy or concealability of the SS communication system deteriorate or a sufficient processing gain is not obtained. Therefore, a method in which the modulation system itself is transformed to a four-phase or quadri-phase shift keying system (QPSK system) that is capable of a transmission rate substantially twice as high as that in the BPSK system without changing the number of bits in the PN code series might be considered.

However, the QPSK system requires the discrimination of four states that are different in phase by 90 degrees though the discrimination of two states different in phase by 180 degrees (or 0 phase and π phase) suffices for the BPSK system. The conventional demodulator has a problem that it can cope with the BPSK system but cannot cope with the QPSK system.

SUMMARY OF THE INVENTION

The objects of the present invention which was made for solving the above problem of the prior art is to provide a demodulator for a QPSK system which uses a surface acoustic wave matched filter and a surface acoustic wave delay line, to provide a surface acoustic wave element for a QPSK system which uses a surface acoustic wave matched filter and a surface acoustic wave delay line, to provide a spread spectrum communication apparatus in which demodulation in a QPSK system is possible using a surface acoustic wave matched filter, and to provide surface acoustic wave parts for a QPSK system which have a surface acoustic wave matched filter and a surface acoustic wave delay line.

BRIEF DESCRIPTION OF THE DRAWINGS

FIG. 2A is a pattern diagram showing a surface acoustic wave element which can be applied to the demodulator shown in FIG. 1;

FIG. 2B is a pattern diagram showing a surface acoustic wave element which can be applied to the demodulator shown in FIG. 1;

FIG. 3A is a pattern diagram showing a surface acoustic wave element according to a second embodiment of the present invention and a demodulator using that element;

FIG. 3B is a pattern diagram showing a surface acoustic wave element according to the second embodiment of the present invention and the demodulator using that element;

FIGS. 9A and 9B each shows a diagram showing a surface acoustic wave element and a demodulating section of a spread spectrum communication apparatus according to a seventh embodiment of the present invention;

FIGS. 13A and 13B respectively show pattern diagrams of a surface acoustic wave matched filter and a composite surface acoustic wave matched filter according to a ninth embodiment of the present invention;

DESCRIPTION OF THE PREFERRED EMBODIMENTS

Figure 1:
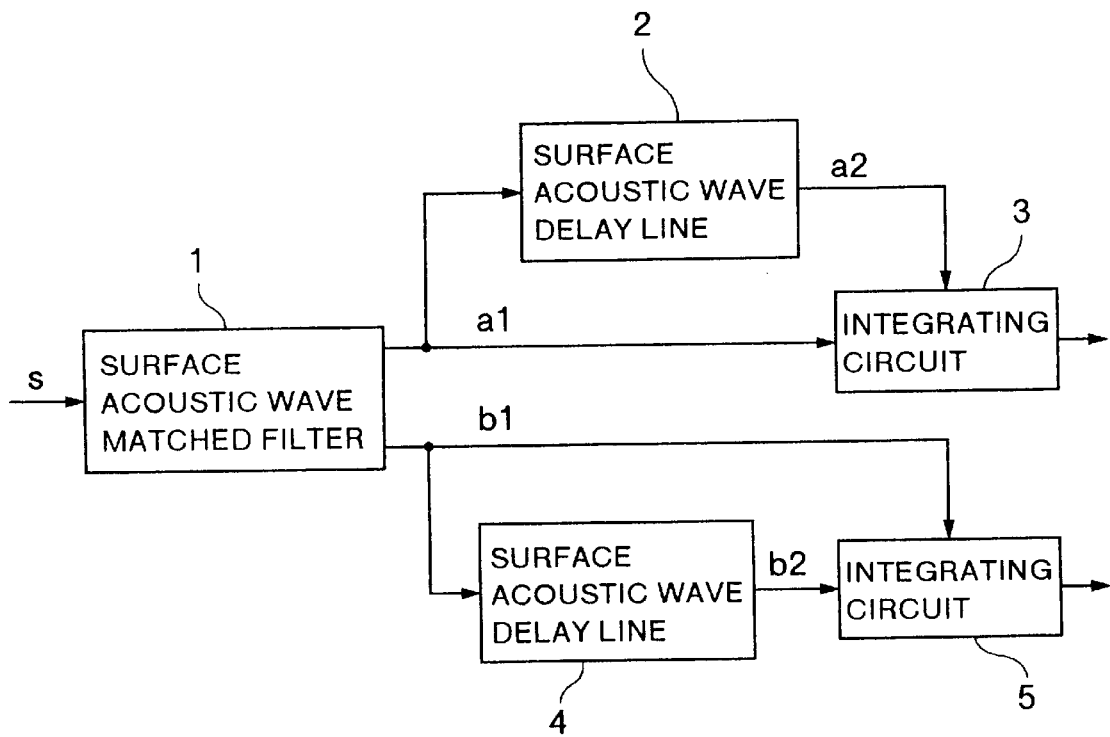
FIG. 1 is a block diagram showing a demodulator for spread spectrum communication according to a first embodiment of the present invention.

FIG. 1 is a block diagram showing a demodulator for spread spectrum communication according to a first embodiment of the present invention. In FIG. 1, reference numeral 1 denotes a surface acoustic wave matched filter, numeral 2 denotes a surface acoustic wave delay line having a delay amount corresponding to $(T+1/f_c/8)$ wherein T is one period of a signal to be received and demodulated and $f_c$ is the carrier frequency of an SS signal s inputted to the surface acoustic wave matched filter 1, numeral 3 denotes an integrating circuit for integrating an output signal a1 of the surface acoustic wave matched filter 1 and an output signal a2 of the surface acoustic wave delay line 2, numeral 4 denotes a surface acoustic wave delay line having a delay amount corresponding to $(T-1/f_c/8)$, and numeral 5 denotes an integrating circuit for integrating an output signal b1 of the surface acoustic wave matched filter 1 and an output signal b2 of the surface acoustic wave delay line 4. With such a construction, the reception of an SS signal based on a QPSK system becomes possible.

The operation of the demodulator having the above construction will now be explained. As has already been mentioned, the QPSK system requires the discrimination of four states different in phase by 90 degrees. In the present embodiment, a signal having an in-phase component is extracted by the surface acoustic wave matched filter 1, the surface acoustic wave delay line 2 and the integrating circuit 3 while a signal having a quadrature-phase component is extracted by the surface acoustic wave matched filter 1, the surface acoustic wave delay line 4 and the integrating circuit 5. Namely, a difference in delay amount between the surface acoustic wave delay line 2 and the surface acoustic wave delay line 4 is $1/f_c/8-(-1/f_c/8)=1/f_c/4$ which corresponds to a phase difference of 90 degrees. The demodulation of the QPSK system is enabled by producing the phase difference of 90 degrees by the surface acoustic wave delay lines.

Next, an explanation will be made of a surface acoustic wave element in which the functions of a surface acoustic wave matched filter and a surface acoustic wave delay line are united and a demodulator which uses such a surface acoustic wave element.

FIGS. 2A and 2B are pattern diagrams showing surface acoustic wave elements which can be applied to the demodulator shown in FIG. 1. More particularly, FIG. 2A shows a surface acoustic wave element which realizes the delay of $(T+1/f_c/8)$ and FIG. 2B shows a surface acoustic wave element which realizes the delay of $(T-1/f_c/8)$. The demodulator shown in FIGS. 2A and 2B corresponds to the demodulator shown in FIG. 1. Namely, the operation of the demodulator of FIGS. 2A and 2B is the same as that of the demodulator of FIG. 1 and the explanation thereof will be omitted. However, the demodulator of FIGS. 2A and 2B is different from the demodulator of FIG. 1 in that two surface acoustic wave matched filters are formed corresponding to two surface acoustic wave delay lines whereas one surface acoustic wave matched filter is used in FIG. 1.

In FIG. 2A, reference numeral 11 denotes a piezoelectric quartz crystal substrate having a mirror-worked surface, numeral 12 denotes a signal input encoding electrode formed on the quartz crystal substrate 11 by use of a lithography technique and made of a material such as Al, Au or the like having a small electrical resistivity, numeral 13 denotes a first output comb-like electrode separated from the signal input encoding electrode 12 by a predetermined interval, numeral 14a denotes a second output comb-like electrode disposed apart from the first output comb-like electrode 13 by $T+1/f_c/8$ (wherein T is one period of a signal to be received and demodulated and $f_c$ is the carrier frequency of an SS signal s inputted to the surface acoustic wave matched filter, as mentioned above) and having the same polarity as that of the first output comb-like electrode 13, numeral 15 denotes acoustic material members formed outside of the input and output electrodes 12 and 14a for the purpose of absorbing unnecessary surface acoustic waves, numeral 16 denotes an earth or ground pattern formed so as to enclose the input and output electrodes 12, 13 and 14a in order to reduce electromagnetically induced noises, numeral 17 denotes a surface acoustic wave element including the components 11, 12, 13, 14a, 15 and 16, and numeral 19 denotes an integrating circuit for integrating an output signal of the first output comb-like electrode 13 and an output signal of the second output comb-like electrode 14a.

The construction of FIG. 2B is substantially the same as that of FIG. 2A but is different therefrom in that a second output comb-like electrode 14b is disposed apart from the first output comb-like electrode 13 by $(T-1/f_c/8)$. In FIG. 2B, reference numeral 18 denotes a surface acoustic wave element including the components 11, 12, 13, 14b, 15 and 16, and numeral 20 denotes an integrating circuit for integrating an output signal of the first output comb-like electrode 13 and an output signal of the second output comb-like electrode 14b.

The demodulator for spread spectrum communication according to the present embodiment includes the surface acoustic wave elements 17 and 18 and the integrating circuits 19 and 20.

In FIGS. 2A and 2B, the number of pairs of electrodes (or electrode fingers) in a comb-like electrode pair group of the signal input encoding electrode 12 corresponding to each code bit is greater than 1 (one). Further, this number of pairs is selected such that it is equal to or smaller than the ratio of the carrier frequency that is used to the chip rate that is used which is a frequency determined by an interval between the groups of comb-like electrode pairs of the signal input encoding electrode 12 corresponding to the respective code bits. With the relation of 1< (the number of pairs of electrodes in a comb-like electrode pair group) ≦ (the carrier frequency to chip rate ratio), it is possible to enhance the efficiency of conversion of the input signal s by the signal input encoding electrode 12 into surface acoustic waves and hence the output efficiencies at the output comb-like electrodes 13, 14a and 14b. Especially, the quartz crystal substrate 11 is suited to the surface acoustic wave matched filter since the temperature coefficient thereof for surface acoustic waves is zero. Also, since the electromechanical coupling coefficient of the quartz crystal substrate 11 is very small or on the order of 0.17%, it is effective to increase the number of pairs of electrodes in the comb-like electrode pair group of the signal input encoding electrode 12 corresponding to each code bit. In the present embodiment, the carrier frequency $f_c$ is 132 MHz and the chip rate is 22 MHz. Therefore, the number of pairs of electrodes in a comb-like electrode pair group is between 2 and 6. FIGS. 2A and 2B show the case where the number of pairs is 4.

In FIG. 1, one surface acoustic wave matched filter is used. However, two filters may be used, as shown in FIGS. 2A and 2B. Also, amplifiers can be used at the front stages of the surface acoustic wave delay lines 2 and 4, as required. Further, the configuration of each of the acoustic material member 15 and the earth pattern 16 is shown in FIGS. 2A and 2B by way of example. The configuration may be arbitrary so long as a satisfactory characteristic is obtained.

The acoustic material member 15 and/or the earth pattern 16 may be omitted if the provision thereof is not necessary even when surface acoustic waves and/or electromagnetically induced noises are taken into consideration. In FIGS. 2A and 2B, the surface acoustic wave elements 17 and 18 are shown such that they are formed on separate substrates. However, they can be formed on the same substrate. In the present embodiment, the polarity of the second output comb-like electrodes 14a and 14b is made the same as that of the first output comb-like electrode 13 so that the same digital signal as a transmitted incoming signal can be demodulated. However, it is possible to make the polarity of the second output comb-like electrodes 14a and 14b reverse to that of the first output comb-like electrode 13. In this case, the demodulated digital signal takes an inverted version of the transmitted signal in which "0" and "1" are inverted to each other. The coping with this can be made by software.

According to the present embodiment mentioned above, two kinds of delays by the surface acoustic wave delay lines 2 and 4 for the SS signal s become possible. The demodulation in the QPSK system becomes possible in such a manner that the integrating circuit 3 (or the integrating circuit 19 in FIG. 2A) extracts an in-phase component signal from four states different in phase by 90 degrees while the integrating circuit 5 (or the integrating circuit 20 in FIG. 2B) extracts a quadrature-phase component signal from the four states different in phase by 90 degrees. Thereby, it is possible to structure an SS communication system which has a high transmission rate.

In the present embodiment, the delay amounts of the surface acoustic wave delay lines 2 and 4 are defined as being $(T+1/f_c/8)$ and $(T-1/f_c/8)$, respectively. However, the case may arise where the delay amount is different due to the length of a pattern on a circuit substrate actually used and/or circuit parts used, thereby generating an error in the delay amount. Therefore, the delay amounts can be defined by the input signals of the integrating circuits 3 and 5. In this case, a delay amount in the surface acoustic wave delay line 2 is established such that the output signal a2 of the surface acoustic wave delay line 2 is delayed for the output signal a1 of the surface acoustic wave matched filter 1 by $(T+1/f_c/8)$ at the time of input to the integrating circuit 3. On the other hand, a delay amount in the surface acoustic wave delay line 4 is established such that the output signal b2 of the surface acoustic wave delay line 4 is delayed for the output signal b1 of the surface acoustic wave matched filter 1 by $(T-1/f_c/8)$ at the time of input to the integrating circuit 5. Thereby, it is possible to obtain a demodulator free of an error in delay amount.

In the foregoing explanation, the surface acoustic wave a delay line is used as delay means. there is no special restriction to such delay means. An electronic circuit such as a shift register may be used.

Also, it is preferable that the abovementioned electrodes and pattern are formed by a conductive material including the simple substance or an alloy of Al, Au, Ag or Cu. Especially, Al among those materials is advantageous in the aspect of cost and has merits including the easiness of etching. An additive such as Si or the like may be added to Al to improve the corrosion resistance. Also, it is preferable that each electrode is fabricated by etching or lift-off. Further, it is preferable that the acoustic material member is formed by a material such as epoxy resin or silicone rubber which has a sound absorbing function (or vibration suppressing function).

(Embodiment 2)

FIGS. 3A and 3B are pattern diagrams showing surface acoustic wave elements according to a second embodiment of the present invention and a demodulator using those elements. FIG. 3A shows a surface acoustic wave element which realizes the delay of $(T+1/f_c/8)$ and FIG. 3B shows a surface acoustic wave element which realizes the delay of $(T-1/f_c/8)$. The demodulator shown in FIGS. 3A and 3B corresponds to the demodulator shown in FIG. 1. Namely, the operation of the demodulator of FIGS. 3A and 3B is the same as that of the demodulator of FIG. 1 and the explanation thereof will be omitted. However, the demodulator of FIGS. 3A and 3B is different from the demodulator of FIG. 1 in that two surface acoustic wave matched filters are formed corresponding to two surface acoustic wave delay lines whereas one surface acoustic wave matched filter is used in FIG. 1.

In FIG. 3A, reference numeral 21 denotes a piezoelectric quartz crystal substrate having a mirror-worked surface, numeral 22 denotes a signal input comb-like electrode formed on the quartz crystal substrate 21 by use of a lithography technique and made of a material such as Al, Au or the like having a small electrical resistivity, numeral 23 denotes a first output encoding electrode separated from the signal input comb-like electrode 22 by a predetermined interval, numeral 24a denotes a second output encoding electrode disposed apart from the first output encoding electrode 23 by $T+1/f_c/8$ (wherein T is one period of a signal to be received and demodulated and $f_c$ is the carrier frequency of an SS signal s inputted to the surface acoustic wave matched filter, as mentioned above) and having the same code series as the first output encoding electrode 23, numeral 25 denotes acoustic material members formed outside of the input and output electrodes 22 and 24a for the purpose of absorbing unnecessary surface acoustic waves, numeral 26 denotes a surface acoustic wave element including the components 21, 22, 23, 24a and 25, and numeral 28 denotes an integrating circuit for integrating an output signal of the first output encoding electrode 23 and an output signal of the second output encoding electrode 24a.

The construction of FIG. 3B is substantially the same as that of FIG. 3A but is different therefrom in that a second output encoding electrode 24b is disposed apart from the first output encoding electrode 23 by $(T-1/f_c/8)$. In FIG. 3B, reference numeral 27 denotes a surface acoustic wave element including the components 21, 22, 23, 24b and 25, and numeral 29 denotes an integrating circuit for integrating an output signal of the first output encoding electrode 23 and an output signal of the second output encoding electrode 24b.

The demodulator for spread spectrum communication according to the present embodiment includes the surface acoustic wave elements 26 and 27 and the integrating circuits 28 and 29.

As in the case of the first embodiment, the present embodiment can improve the conversion efficiency and hence the output efficiency by selecting the number of pairs of electrodes in a group of comb-like electrode pair of the first and second output encoding electrode 23, 24a and 24b corresponding to each code bit so that it is greater than 1 and equal to or smaller than the ratio of the carrier frequency that is used to the chip rate that is used.

In FIGS. 3A and 3B, the configuration of the acoustic material member 25 is shown by way of example. The configuration may be arbitrary so long as a satisfactory characteristic is obtained. Also, the acoustic material member 25 may be omitted if the provision thereof is not necessary even when surface acoustic waves are taken into consideration. In FIGS. 3A and 3B, the surface acoustic wave elements 26 and 27 are shown such that they are formed on separate substrates. However, they can be formed on the same substrate. In the present embodiment too, the polarity of the second output encoding electrodes 24*a* and 24*b* may be made reverse to that of the first output encoding electrode 23 as in the case of the first embodiment.

According to the present embodiment mentioned above, two kinds of delays by the output encoding electrodes 23, 24*a* and 24*b* for the SS signal s become possible. The demodulation in the QPSK system becomes possible in such a manner that the integrating circuit 28 extracts an in-phase component signal from four states different in phase by 90 degrees while the integrating circuit 29 extracts a quadrature-phase component signal from the four states different in phase by 90 degrees. Thereby, it is possible to structure an SS communication system which has a high transmission rate.

(Embodiment 3)

Figure 4:
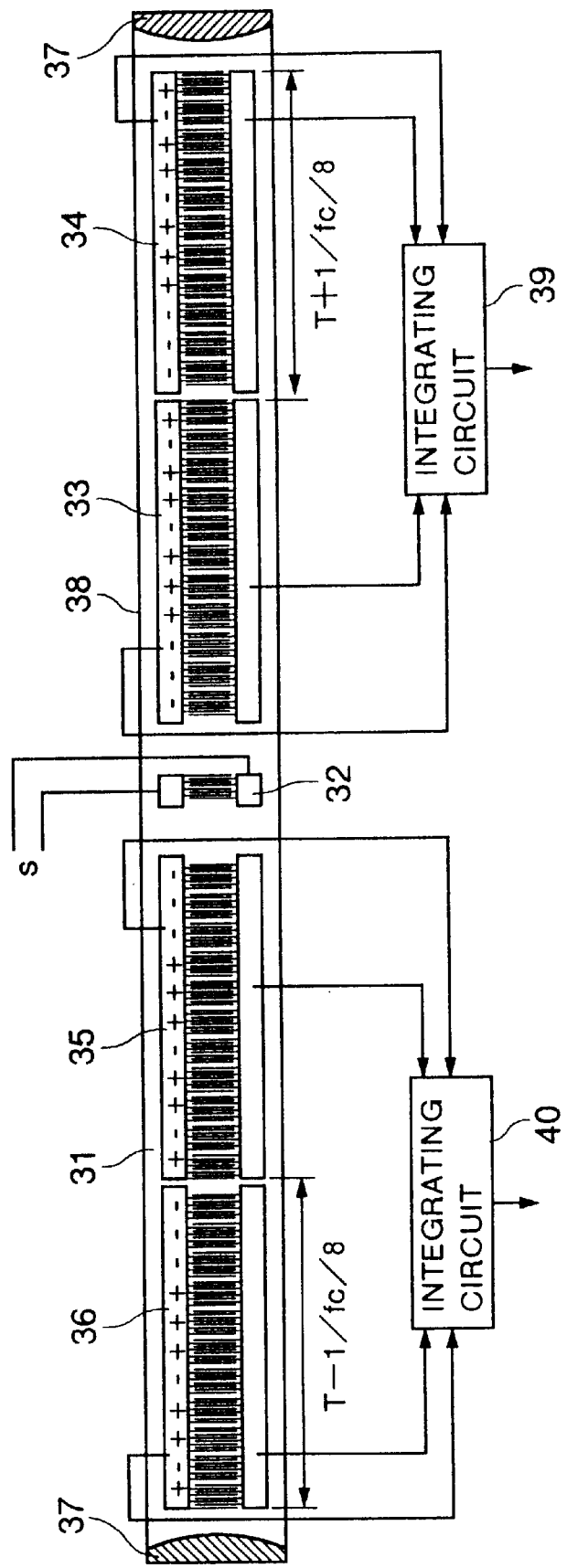
FIG. 4 is a pattern diagram showing a surface acoustic wave element according to a third embodiment of the present invention and a demodulator using that element.

FIG. 4 is a pattern diagram showing a surface acoustic wave element according to a third embodiment of the present invention and a demodulator using that element. The demodulator shown in FIG. 4 corresponds to the demodulator shown in FIG. 1. Namely, the operation of the demodulator of FIG. 4 is the same as that of the demodulator of FIG. 1 and the explanation thereof will be omitted. However, the demodulator of FIG. 4 is different from the demodulator of FIG. 1 in that two surface acoustic wave matched filters are formed corresponding to two surface acoustic wave delay lines whereas one surface acoustic wave matched filter is used in FIG. 1.

In FIG. 4, reference numeral 31 denotes a piezoelectric quartz crystal substrate having a mirror-worked surface, numeral 32 denotes a signal input comb-like electrode formed on the quartz crystal substrate 31 by use of a lithography technique and made of a material such as Al, Au or the like having a small electrical resistivity, numeral 33 denotes a first output encoding electrode separated from the signal input comb-like electrode 32 by a predetermined interval, numeral 34 denotes a second output encoding electrode disposed apart from the first output encoding electrode 33 by $T+1/f_c/8$ (wherein T is one period of a signal to be received and demodulated and $f_c$ is the carrier frequency of an SS signal s inputted to the surface acoustic wave matched filter, as mentioned above) and having the same code series as the first output encoding electrode 33, numeral 35 denotes a third output encoding electrode separated from the signal input comb-like electrode 32 by a predetermined interval in a direction opposite to the first output encoding electrode 33 and having a code series which is symmetrical to the first output encoding electrode 33 with respect to the signal input comb-like electrode 32, numeral 36 denotes a fourth output encoding electrode disposed apart from the third output encoding electrode 35 by $T-1/f_c/8$ and having the same code series as the third output encoding electrode 35, numeral 37 denotes acoustic material members formed outside of the output encoding electrodes 34 and 36 for the purpose of absorbing unnecessary surface acoustic waves, numeral 38 denotes a surface acoustic wave element including the components 31, 32, 33, 34, 35, 36 and 37, numeral 39 denotes an integrating circuit for integrating an output signal of the first output encoding electrode 33 and an output signal of the second output encoding electrode 34, and numeral 40 denotes an integrating circuit for integrating an output signal of the third output encoding electrode 35 and an output signal of the fourth output encoding electrode 36.

The demodulator for spread spectrum communication according to the present embodiment includes the surface acoustic wave element 38 and the integrating circuits 39 and 40. In the present embodiment, the encoding electrodes having the code series symmetrical to each other are formed on both the sides of the signal input comb-like electrode 32, expoiting the fact that surface acoustic waves generated from the signal input comb-like electrode 32 propagate to both the sides thereof.

As in the case of the first embodiment, the present embodiment can improve the conversion efficiency and hence the output efficiency by selecting the number of pairs of electrodes in a comb-like electrode pair group of the first to fourth output encoding electrodes 33 to 36 corresponding to each code bit so that it is greater than 1 and equal to or smaller than the ratio of the used carrier frequency that is used to the chip rate that is used.

In FIG. 4, the configuration of the acoustic material members 37 is shown by way of example. The configuration may be arbitrary so long as a satisfactory characteristic is obtained. Also, the acoustic material members 37 may be omitted if the provision thereof is not necessary even when surface acoustic waves are taken into consideration. In the present embodiment too, the polarity of the second output encoding electrodes 34 may be made reverse to that of the first output encoding electrode 33 and the polarity of the fourth output encoding electrode 36 may be made reverse to that of the third output encoding electrode 35, as in the case of the first embodiment.

According to the present embodiment mentioned above, two kinds of delays by the output encoding electrodes 33 and 34 and the output encoding electrodes 35 and 36 for the SS signal s becomes possible. Demodulation in the QPSK system becomes possible in such a manner that the integrating circuit 39 extracts an in-phase component signal from four states different in phase by 90 degrees while the integrating circuit 40 extracts a quadrature-phase component signal from the four states different in phase by 90 degrees. Thereby, it is possible to structure an SS communication system which has a high transmission rate.

(Embodiment 4)

Figure 5:
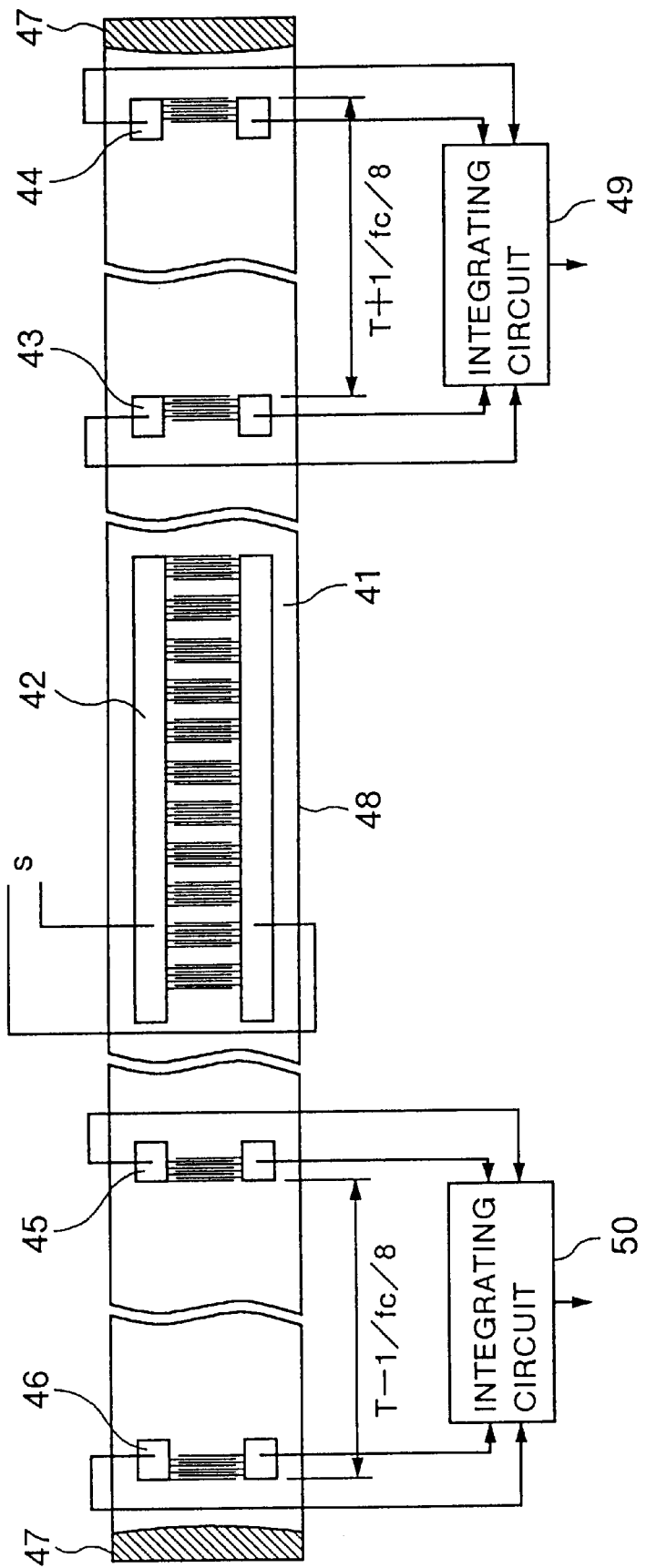
FIG. 5 is a pattern diagram showing a surface acoustic wave element according to a fourth embodiment of the present invention and a demodulator using that element.

FIG. 5 is a pattern diagram showing a surface acoustic wave element according to a fourth embodiment of the present invention and a demodulator using that element. The demodulator shown in FIG. 5 corresponds to the demodulator shown in FIG. 1. Namely, the operation of the demodulator of FIG. 5 is the same as that of the demodulator of FIG. 1 and the explanation thereof will be omitted. The construction of the demodulator of FIG. 5 is basically similar to that of the demodulator of FIG. 4.

In FIG. 5, reference numeral 41 denotes a piezoelectric quartz crystal substrate having a mirror-worked surface, numeral 42 denotes a signal input encoding electrode formed on the quartz crystal substrate 41 by use of a lithography technique and made of a material such as Al, Au or the like having a small electrical resistivity, numeral 43 denotes a first output comb-like electrode separated from the signal input encoding electrode 42 by a predetermined interval, numeral 44 denotes a second output comb-like electrode disposed apart from the first output comb-like electrode 43 by $T+1/f_c/8$ (wherein T is one period of a signal to be received and demodulated and $f_c$ is the carrier frequency of an SS signal s inputted to the surface acoustic wave matched filter, as mentioned above) and having the same polarity as that of the first output comb-like electrode 43, numeral 45 denotes a third output comb-like electrode which is separated from the signal input encoding electrode 42 by a predetermined interval in a direction opposite to the first output comb-like electrode 43 and which is symmetrical to the first output comb-like electrode 43 with respect to the signal input encoding electrode 42, numeral 46 denotes a fourth output comb-like electrode disposed apart from the third output comb-like electrode 45 by $T-1/f_c/8$ and having the same polarity as that of the third output comb-like electrode 45, numeral 47 denotes acoustic material members formed outside of the output comb-like electrodes 44 and 46 for the purpose of absorbing unnecessary surface acoustic waves, numeral 48 denotes a surface acoustic wave element including the components 41, 42, 43, 44, 45, 46 and 47, numeral 49 denotes an integrating circuit for integrating an output signal of the first output comb-like electrode 43 and an output signal of the second output comb-like electrode 44, and numeral 50 denotes an integrating circuit for integrating an output signal of the third output comb-like electrode 45 and an output signal of the fourth output comb-like electrode 46. In the present embodiment too, comb-like electrodes that are symmetrical to each other are formed on both sides of the signal input encoding electrode 42, exploiting the fact that surface acoustic waves generated from the signal input encoding electrode 42 propagate to both the sides thereof.

As in the case of the first embodiment, the present embodiment can improve the conversion efficiency and hence the output efficiency by selecting the number of pairs of electrodes in a comb-like electrode pair group of the input encoding electrode 42 corresponding to each code bit so that it is greater than 1 and equal to or smaller than the ratio of the carrier frequency that is used to the chip rate that is used. In the present embodiment too, the polarity of the second output comb-like electrodes 44 may be made reverse to that of the first output comb-like electrode 43 and the polarity of the fourth output comb-like electrode 46 may be made reverse to that of the third output comb-like electrode 45, as in the case of the first embodiment.

According to the present embodiment mentioned above, two kinds of delays by the output comb-like electrodes 43 and 44 and the output comb-like electrodes 45 and 46 for the SS signal s become possible. Demodulation in the QPSK system becomes possible in such a manner that the integrating circuit 49 extracts an in-phase component signal from four states different in phase by 90 degrees while the integrating circuit 50 extracts a quadrature-phase component signal from the four states different in phase by 90 degrees. Thereby, it is possible to structure an SS communication system which has a high transmission rate.

(Embodiment 5)

Figure 6:
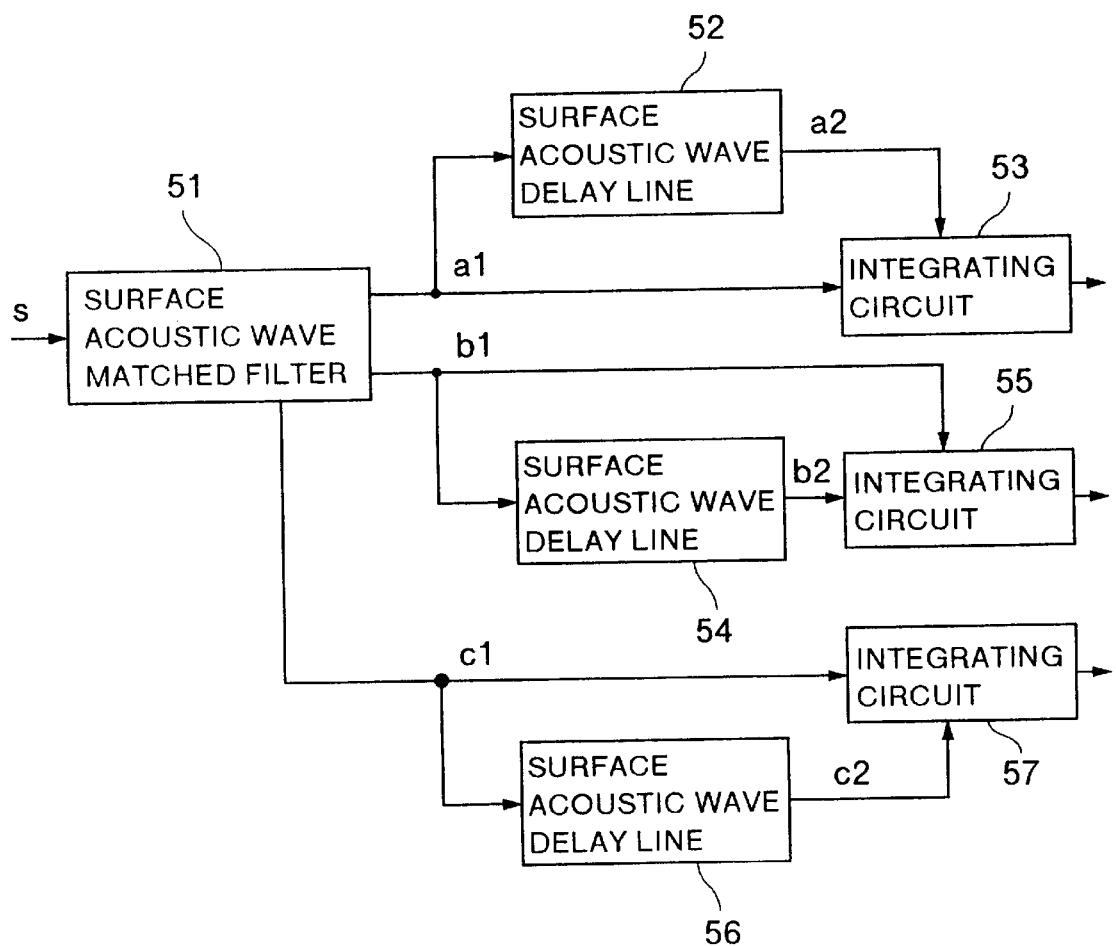
FIG. 6 is a block diagram showing a demodulator for spread spectrum communication according to a fifth embodiment of the present invention.

FIG. 6 is a block diagram showing a demodulator for spread spectrum communication according to a fifth embodiment of the present invention. The demodulator according to the fifth embodiment is applicable to the QPSK system and is also applicable to the BPSK system. The demodulator is further applicable to a system in which the BPSK system and the QPSK system coexist. In FIG. 6, showing the fifth embodiment, reference numeral 51 denotes a surface acoustic wave matched filter, numeral 52 denotes a surface acoustic wave delay line having a delay amount corresponding to $(T+1/f_c/8)$ wherein T is one period of a signal to be received and demodulated and $f_c$ is the carrier frequency of an SS signal s inputted to the surface acoustic wave matched filter, numeral 53 denotes an integrating circuit for integrating an output signal a1 of the surface acoustic wave matched filter 51 and an output signal a2 of the surface acoustic wave delay line 52, numeral 54 denotes a surface acoustic wave delay line having a delay amount corresponding to $(T-1/f_c/8)$, numeral 55 denotes an integrating circuit for integrating an output signal b1 of the surface acoustic wave matched filter 51 and an output signal b2 of the surface acoustic wave delay line 54, numeral 56 denotes a surface acoustic wave delay line having a delay amount corresponding to T, and numeral 57 denotes an integrating circuit for integrating an output signal c1 of the surface acoustic wave matched filter 51 and an output signal c2 of the surface acoustic wave delay line 56.

Since the operation of the demodulator having the above construction is similar to that of the demodulator shown in FIG. 1, the explanation thereof will be omitted.

Figure 11:
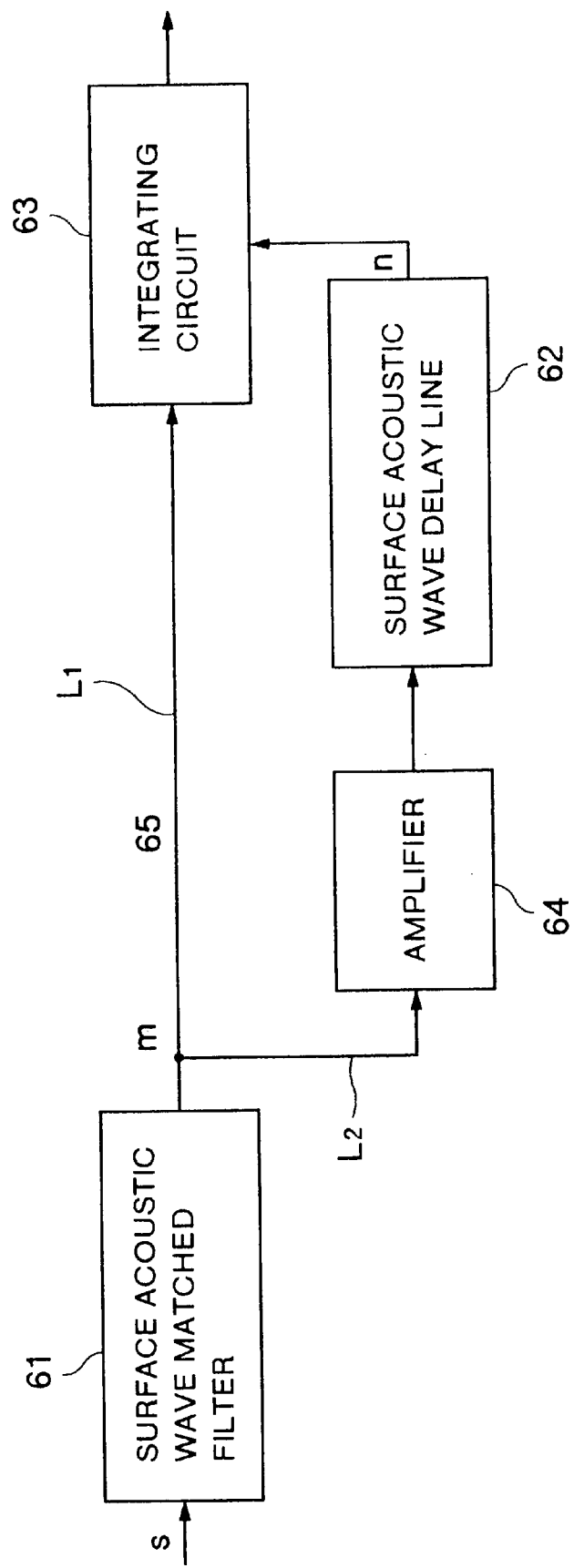
FIG. 11 is a block diagram showing the construction of a demodulating section of the conventional spread spectrum communication apparatus.
Figure 12A:
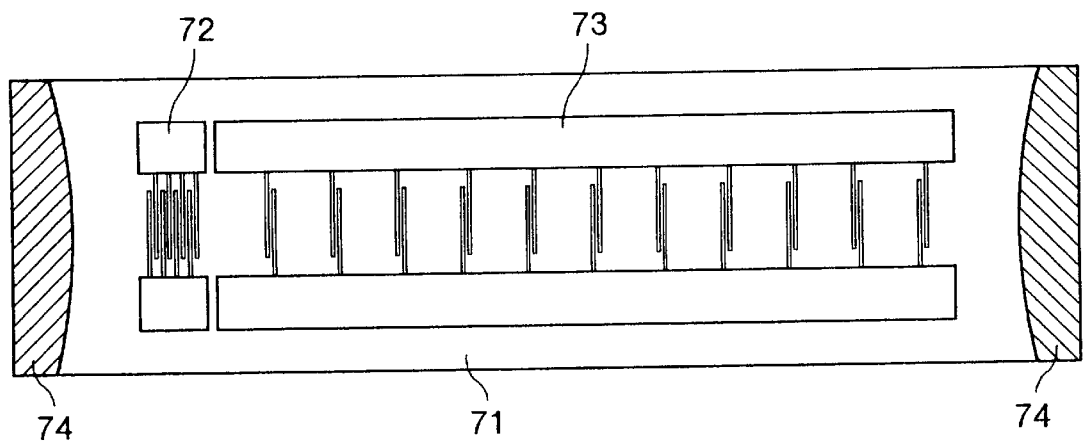
FIGS. 12A and 12B are diagrams showing the conventional surface acoustic wave matched filter and the conventional surface acoustic wave delay line as delay means, respectively.
Figure 12B:
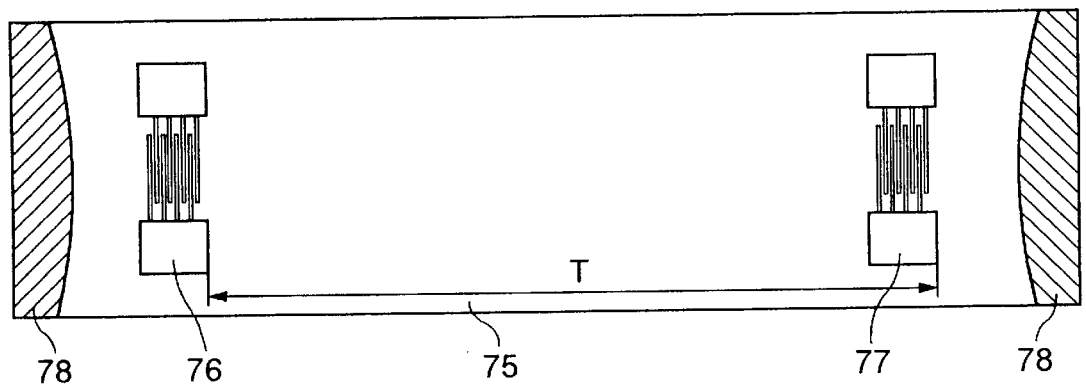

Though one surface acoustic wave filter 51 is used in FIG. 6, three surface acoustic wave matched filters may be used for the surface acoustic wave delay lines 52, 54 and 56, respectively. As in the case of the conventional demodulator shown in FIG. 11, amplifiers can be used at the front stages of the surface acoustic wave delay lines 52, 54 and 56, as required.

Explaining the relationship between the present embodiment and the first to fourth embodiments, the same construction as that of the present embodiment is obtained in conjunction with the first and second embodiments if a surface acoustic wave element having an interval corresponding to T is added to the construction of the first and second embodiments. In conjunction with the third and fourth embodiments, the same construction as that of the present embodiment is obtained if a surface acoustic wave element having an interval corresponding to T is added separately to the construction of the third or fourth embodiment. In the case where the demodulator according to the present embodiment is actually developed into a pattern, all components may be developed on the same substrate or a surface acoustic wave element having a surface acoustic wave matched filter and a surface acoustic wave delay line may be formed discretely on a separate substrate for the BPSK system.

According to the present embodiment mentioned above, three kinds of delays by the surface acoustic wave delay lines 52, 54 and 56 for the SS signal s become possible. Demodulation in the QPSK system becomes possible in such a manner that the integrating circuit 53 extracts an in-phase component signal from four states different in phase by 90 degrees while the integrating circuit 55 extracts a quadrature-phase component signal from the four states different in phase by 90 degrees. Thereby, it is possible to structure an SS communication system which has a high transmission rate. Also, with the provision of the surface acoustic wave delay line 56 having the delay amount corresponding to T, not only demodulation in the QPSK system but also demodulation in the BPSK system become possible, thereby enabling the structuring of an SS communication system which has a high transmission rate and which is applicable to both the QPSK and BPSK systems.

(Embodiment 6)

Figure 7A:
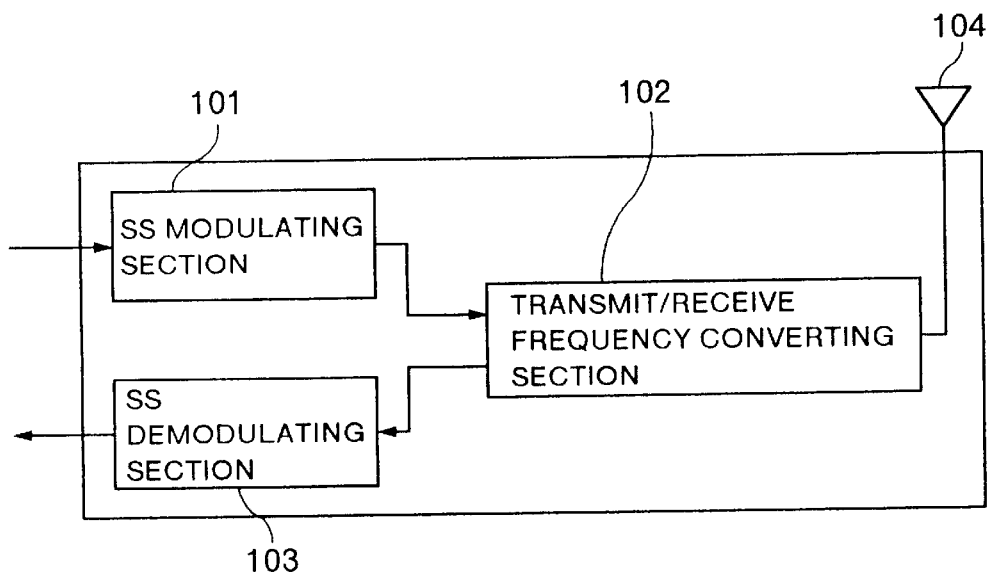
FIG. 7A is a block diagram showing a spread spectrum communication apparatus according to a sixth embodiment of the present invention.
Figure 7B:
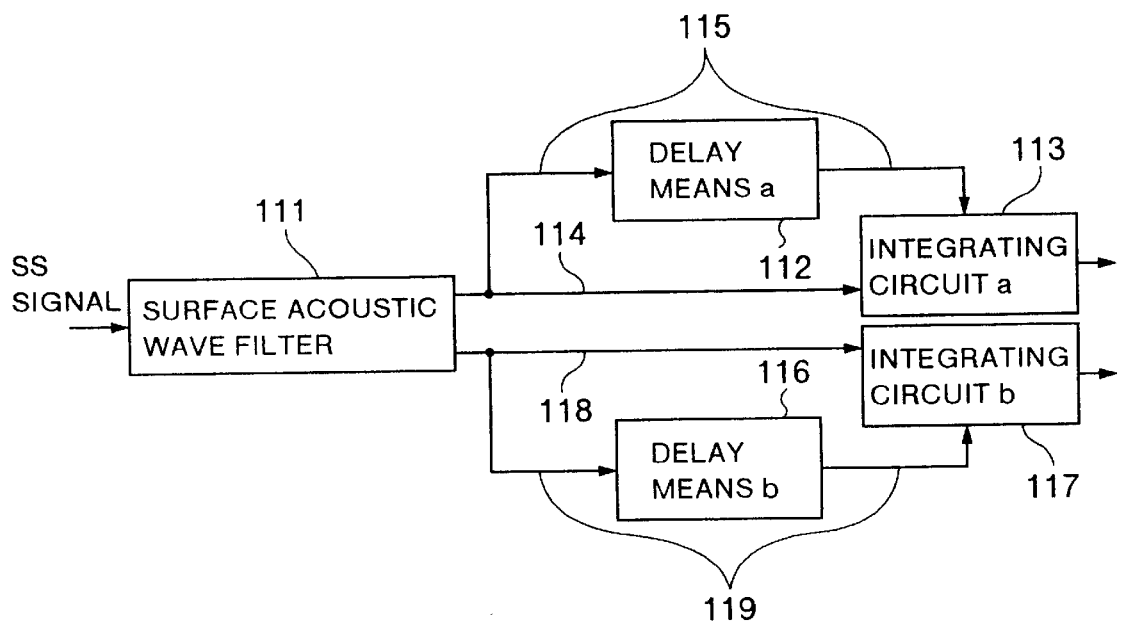
FIG. 7B is a block diagram showing an SS demodulating section in the spread spectrum communication apparatus shown in FIG. 7A.

FIG. 7A is a block diagram showing a spread spectrum communication apparatus according to a sixth embodiment of the present invention, and FIG. 7B is a block diagram showing an SS demodulating section. In FIG. 7A, reference numeral 101 denotes an SS modulating section for converting data to be transmitted into an SS signal using a predetermined code series, numeral 102 denotes a transmit/receive frequency converting section for making conversion in frequency between the SS signal and a transmit/receive signal, numeral 103 an SS demodulating section for demodulating a spread spectrum communication signal into the original data of a transmitted signal, and numeral 104 denotes an antenna for transmitting and receiving a signal. Though the construction of one transceiver using one transmit/receive frequency converting section is explained in the above, the present invention is not limited to such a circuit construction. The present invention can be embodied in a spread spectrum communication apparatus inclusive of the SS demodulating section having a required construction such as a construction in which the frequency converting section is divided into a part for transmission and a part for reception or a construction in which a transmitter and a receiver are separated.

In FIG. 7B, reference numeral 111 denotes a surface acoustic wave matched filter, numeral 112 denotes delay means a, numeral 113 denotes an integrating circuit a for integrating an output signal of the surface acoustic wave matched filter 111 and an output signal of the delay means 112, and numerals 114 and 115 denotes signal lines. A delay amount in the delay means 112 is established such that an input signal from the delay means 112 to the integrating circuit 113 is delayed for an input signal from the surface acoustic wave matched filter 111 by a time corresponding to $T+(\pm n+a/8)/f_c$ (wherein T is one period of a signal to be received and demodulated, n is an integral number which is between 0 and a value twice as large as the ratio of the carrier frequency $f_c$ of a signal inputted to the surface acoustic wave matched filter to a chip rate or a frequency determined from an interval between groups of comb-like electrode pairs of an encoding electrode corresponding to respective code bits, and a satisfies $½ \leq a \leq 3/2$) at the time of input to the integrating circuit 113. Also, numeral 116 denotes delay means b, numeral 117 denotes an integrating circuit b for integrating an output signal of the surface acoustic wave matched filter 111 and an output signal of the delay means 116, and numerals 118 and 119 denotes signal lines. The delay amount of the delay means 116 is established such that an input signal from the delay means 116 to the integrating circuit 117 is delayed with respect to an input signal from the surface acoustic wave matched filter 111 by a time corresponding to $T+(\pm m-a/8)/f_c$ at the time of input to the integrating circuit 117. Here, m is also an integral number which is between 0 and a value twice as large as the ratio of the carrier frequency $f_c$ to the chip rate. With such a construction, the reception of an SS signal based on the QPSK system becomes possible. In this case, it is preferable that m and n are both equal to 0 and a is equal to 1.

The operation of the demodulating section of the spread spectrum communication apparatus having the above construction will now be explained. In the case of the QPSK system, it is necessary to discriminate four states different in phase by 90 degrees, as has already been mentioned above. In the present embodiment, an in-phase component signal is extracted by the surface acoustic wave matched filter 111, the delay means 112 and the integrating circuit 113 and a quadrature-phase component signal is extracted by the surface acoustic wave matched filter 111, the delay means 116 and the integrating circuit 117. The difference between the delay amount of the delay means 112 and the delay amount of the delay means 116 is $(\pm n+a/8)/f_c-(\pm m-a/8)/f_c=(\pm n-\pm m)/f_c+a/4/f_c$, which corresponds to a phase difference of 90 degrees. This phase difference of 90 degrees is produced by surface acoustic wave delay lines, thereby enabling the demodulation in the QPSK system.

As in the prior art, the surface acoustic wave delay line or an electronic circuit such as a shift register can be used as the delay means. However, the delay amount at the time of input to the integrating circuit 113 or 117 is important. Namely, there is no special restriction to the delay means.

In the shown example, one surface acoustic wave matched filter is used. However, surface acoustic wave matched filters may be used corresponding in number to the respective surface acoustic wave delay means. Depending on the selection of the delay means, an amplifier may be used as in the prior art, as required.

Figure 8A:
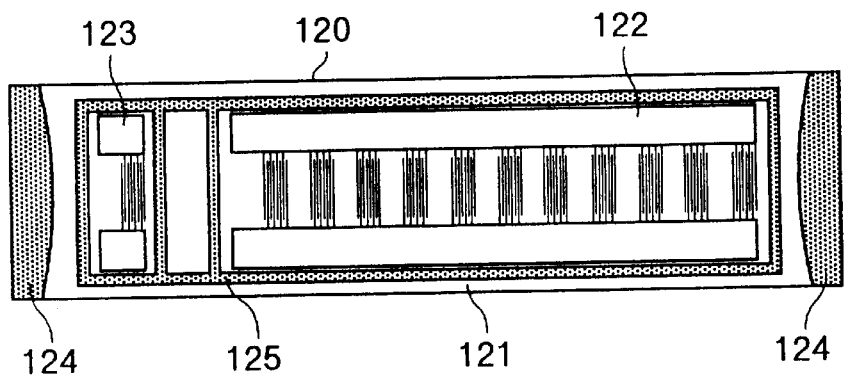
FIG. 8A is a pattern diagram showing a surface acoustic wave matched filter used in the sixth embodiment of the present invention.
Figure 8B:
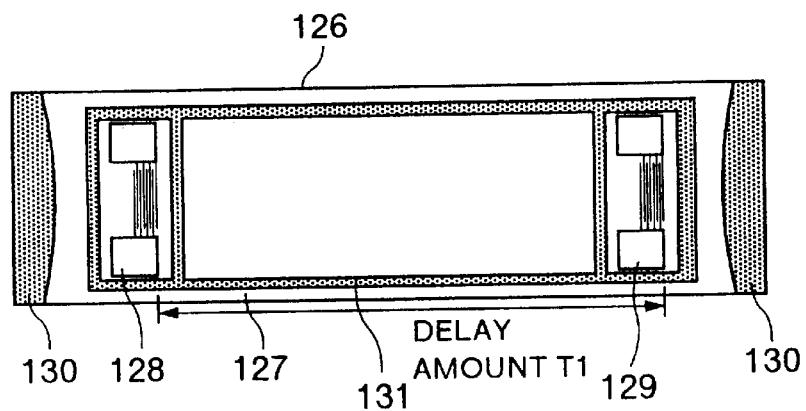
FIGS. 8B and 8C are pattern diagrams showing surface acoustic wave delay lines used in the sixth embodiment of the present invention.
Figure 8C:
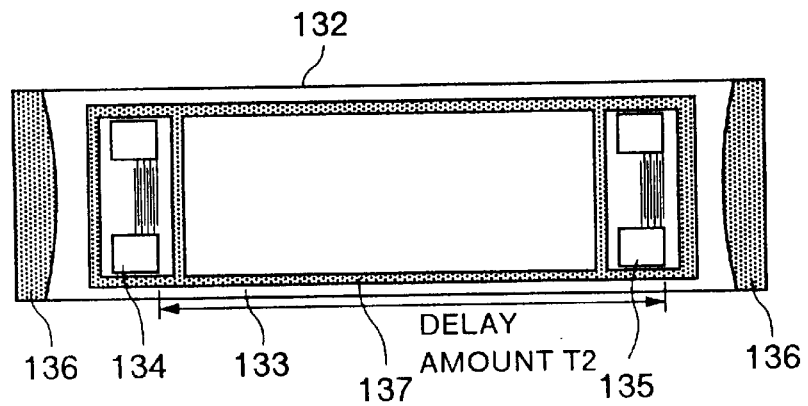

A detailed explanation will be made of the case where the surface acoustic wave matched filter 111 and surface acoustic wave delay lines as the delay means 112 and 116 are used. The explanation will be made using FIGS. 8A, 8B and 8C. FIG. 8A shows a surface acoustic wave matched filter used in the present embodiment, and FIGS. 8B and 8C show surface acoustic wave delay lines used as the delay means. In FIG. 8A, reference numeral 121 denotes a piezoelectric substrate made of a quartz crystal having a mirror-worked surface, numeral 122 denotes an input encoding electrode formed on the quartz crystal substrate 121 by use of a lithography technique and made of a material such as Al, Au or the like having a small electrical resistivity, and numeral 123 denotes an output comb-like electrode similarly formed apart from the encoding electrode 122 by a predetermined interval and made of a material such as Al, Au or the like having a small electrical resistivity. For the purpose of absorbing unnecessary surface acoustic waves, acoustic material members 124 are formed outside of the input and output electrodes, as required. In order to reduce electromagnetically induced noises, an earth or ground pattern 125 is formed to enclose the input and output electrodes, as required. With the above construction, a surface acoustic wave matched filter 120 is formed. The number of pairs of electrodes in a group of comb-like electrode pairs of the signal input encoding electrode 122 corresponding to each code bit is greater than 1. Further, this number of pairs is selected such that it is equal to or smaller than the ratio of the carrier frequency that is used to the chip rate that is used, that is, a frequency determined by an interval between the comb-like electrode pair groups of the signal input encoding electrode 122 corresponding to the respective code bits. With the relation of 1< (the number of pairs of electrodes in a comb-like electrode pair group) $\leq$ (the carrier frequency to chip rate ratio), it is possible to enhance the efficiency of conversion of an input signal s by the signal input encoding electrode 122 into surface acoustic waves and hence the output efficiencies at the output comb-like electrode 123. Especially, the quartz crystal substrate is suited to the surface acoustic wave matched filter since the temperature coefficient thereof for SAW is zero. Also, since the electromechanical coupling coefficient of the quartz crystal substrate is very small or on the order of 0.17%, it is effective to increase the number of pairs of electrodes in the comb-like electrode pair group of the encoding electrode corresponding to each code bit. In the present embodiment, the carrier frequency $f_c$ is 132 MHz and the chip rate is 22 MHz. Therefore, the number of pairs of electrodes in a comb-like electrode pair group is between 2 and 6. FIG. 8A shows the case where the number of pairs is 4. In this case, the input electrode and the output electrode may be reversed, that is, the signal input encoding electrode and the output comb-like electrode may be used as an output electrode and an input electrode, respectively.

In FIG. 8B, reference numeral 127 denotes a piezoelectric substrate made of a quartz crystal having a mirror-worked surface, numeral 128 denotes an input comb-like electrode formed on the quartz crystal substrate 127 by use of a lithography technique and made of a material such as Al, Au or the like having a small electrical resistivity, and numeral 129 denotes an output comb-like electrode similarly formed apart from the input comb-like electrode 128 by a predetermined interval and made of a material such as Al, Au or the like having a small electrical resistivity. For the purpose of absorbing unnecessary surface acoustic waves, acoustic material members 130 are formed outside of the input and output electrodes, as required. In order to reduce electromagnetically induced noises, an earth pattern 131 is formed to enclose the input and output electrodes, as required. With the above construction, a surface acoustic wave delay line 126 is formed as the first delay means.

In FIG. 8C, reference numeral 133 denotes a piezoelectric substrate made of a quartz crystal having a mirror-worked surface, numeral 134 denotes an input comb-like electrode formed on the quartz crystal substrate 133 by use of a lithography technique and made of a material such as Al, Au or the like having a small electrical resistivity, and numeral 135 denotes an output comb-like electrode similarly formed apart from the input comb-like electrode 134 by a predetermined interval and made of a material such as Al, Au or the like having a small electrical resistivity. For the purpose of absorbing unnecessary surface acoustic waves, acoustic material members 136 are formed outside of the input and output electrodes, as required. In order to reduce electro-magnetically induced noises, an earth pattern 137 is formed to enclose the input and output electrodes, as required. With the above construction, a surface acoustic wave delay line 132 is formed as the second delay means.

In this case, the delay amounts of the surface acoustic wave delay lines 126 and 132 are different depending on the lengths of the signal lines (or patterns) 114, 115, 118 and 119 on circuit substrates actually used and/or circuit parts used. The delay amount T1 of the surface acoustic wave delay line 126 is set to a value such that an input signal from the surface acoustic wave delay line 126 at the time of input to the integrating circuit is delayed with respect to an input signal from the surface acoustic wave matched filter 120 by a time corresponding to T+($\pm$n+a/8)/$f_c$. The delay amount T2 of the surface acoustic wave delay line 132 is set to a value such that an input signal from the surface acoustic wave delay line 132 at the time of input to the integrating circuit is delayed with respect to an input signal from the surface acoustic wave matched filter 120 by a time corresponding to T+($\pm$m−a/8)/$f_c$.

(Embodiment 7)

FIGS. 9A and 9B are pattern diagrams showing surface acoustic wave elements according to a seventh embodiment of the present invention and a demodulating section using those elements. FIG. 9A shows a surface acoustic wave element which realizes a delay of T+($\pm$n+a/8)/$f_c$, and FIG. 9B shows a surface acoustic wave element which realizes a delay of T+($\pm$m−a/8)/$f_c$. The demodulating section shown in FIGS. 9A and 9B corresponds to the demodulating section shown in FIG. 7B. Namely, the operation of the demodulating section of FIGS. 9A and 9B is the same as that of the demodulating section of FIG. 7B and the explanation thereof will be omitted. However, the demodulating section of FIGS. 9A and 9B is different from the demodulating section of FIG. 7B, since two surface acoustic wave matched filters corresponding to two surface acoustic wave delay lines are used whereas one surface acoustic wave matched filter is used in FIG. 7B.

In FIG. 9A, reference numeral 141 denotes a piezoelectric quartz crystal substrate having a mirror-worked surface, numeral 142 denotes a signal input encoding electrode formed on the quartz crystal substrate 141 by use of a lithography technique and made of a material such as Al, Au or the like having a small electrical resistivity, numeral 143 denotes a first output comb-like electrode similarly formed apart from the signal input encoding electrode 142 by a predetermined interval and made of a material such as Al, Au or the like having a small electrical resistivity, numeral 144a denotes a second output comb-like electrode disposed apart from the first output comb-like electrode 143 by T+($\pm$n+a/8)/$f_c$ (wherein T is one period of a signal to be received and demodulated, n is an integral number which is equal to or smaller than a value twice as large as the ratio of the carrier frequency $f_c$ of a signal inputted to the surface acoustic wave matched filter to a chip rate or a frequency determined from an interval between comb-like electrode pair groups of the encoding electrode corresponding to respective code bits, and a satisfies ½≦a≦3/2, as mentioned above), having the same polarity as that of the first output comb-like electrode 143 and made of a material such as Al, Au or the like having a small electrical resistivity, numeral 145 denotes acoustic material members formed outside of the input and output electrodes 142 and 144a for the purpose of absorbing unnecessary surface acoustic waves, numeral 146 denotes an earth pattern formed so as to enclose the input and output electrodes 142, 143 and 144a in order to reduce electro-magnetically induced noises, numeral 147 denotes a surface acoustic wave element including the components 141, 142, 143, 144a, 145 and 146, and numeral 149 denotes an integrating circuit for integrating an output signal of the first output comb-like electrode 143 and an output signal of the second output comb-like electrode 144a. In this case, it is preferable that n and a are equal to 0 and 1, respectively.

The construction of FIG. 9B is substantially the same as that of FIG. 9A but is different therefrom in that a second output comb-like electrode 144b is disposed apart from the first output comb-like electrode 143 by T+($\pm$m−a/8)/$f_c$ (wherein T is one period of a signal to be received and demodulated, m is an integral number which is equal to or smaller than a value twice as large as the ratio of the carrier frequency $f_c$ of a signal inputted to the surface acoustic wave matched filter to a chip rate or a frequency determined from an interval between comb-like electrode pair groups of the encoding electrode corresponding to respective code bits, and a satisfies ½≦a≦3/2, as mentioned above). In FIG. 9B, reference numeral 148 denotes a surface acoustic wave element including the components 141, 142, 143, 144b, 145 and 146, and numeral 150 denotes an integrating circuit for integrating an output signal of the first output comb-like electrode 143 and an output signal of the second output comb-like electrode 144b. In this case, it is preferable that m and a are equal to 0 and 1, respectively.

As in the case of the sixth embodiment, the present embodiment can improve the conversion efficiency and hence the output efficiency by selecting the number of pairs of electrodes in a group of comb-like electrode pairs of the input encoding electrode 142 corresponding to each code bit so that it is greater than 1 and equal to or smaller than the ratio of the carrier frequency to the chip rate. Also, the input electrode and the output electrode may be reversed, that is, the signal input encoding electrode and the output comb-like electrode may be used as an output electrode and an input electrode, respectively.

In FIGS. 9A and 9B, the configuration of the acoustic material member 145 is shown by way of example. The configuration may be arbitrary so long as a satisfactory characteristic is obtained. Also, the acoustic material members 145 may be omitted if the provision thereof is not necessary even when surface acoustic waves are taken into consideration. In FIGS. 9A and 9B, the surface acoustic wave elements 147 and 148 are shown such that they are formed on separate substrates. However, they can be formed on the same substrate. In the case where the surface acoustic wave elements 147 and 148 are formed on the same substrate, the arrangement of electrodes can be selected freely. For example, there may be employed an arrangement of electrodes in which the input encoding electrode 142 is made common with a pair of the output comb-like electrodes 143 and 144a and a pair of the output comb-like electrodes 143 and 144b is provided symmetrically with respect to the common input encoding electrode 142 along the direction of propagation of surface acoustic waves. In the present embodiment too, the polarity of the second output comb-like electrodes 144a and 144b may be made reverse to that of the first output comb-like electrode 143 as in the case of the first embodiment.

In the present embodiment, the delay amount at the time of input to the integrating circuit is defined by the surface acoustic wave element by making a design so that the influence of the circuit parts used or the like on the delay amount is negligible. However, when the influence of the circuit parts used or the like is taken into consideration, the delay amounts in the surface acoustic wave elements are set such that they are $T+(\pm n+a/8)/f_c$ and $T+(\pm m-a/8)/f_c$ at the time of input to the integrating circuits 149 and 150, respectively.

According to the present embodiment mentioned above, two kinds of delays by the output comb-like electrodes 143, 144a and 144b for the SS signal s becomes possible. Demodulation in the QPSK system becomes possible in such a manner that the integrating circuit 149 extracts an in-phase component signal from four states different in phase by 90 degrees while the integrating circuit 150 extracts a quadrature-phase component signal from the four states different in phase by 90 degrees. Thereby, it is possible to structure an SS communication system which has a high transmission rate.

(Embodiment 8)

Figure 10:
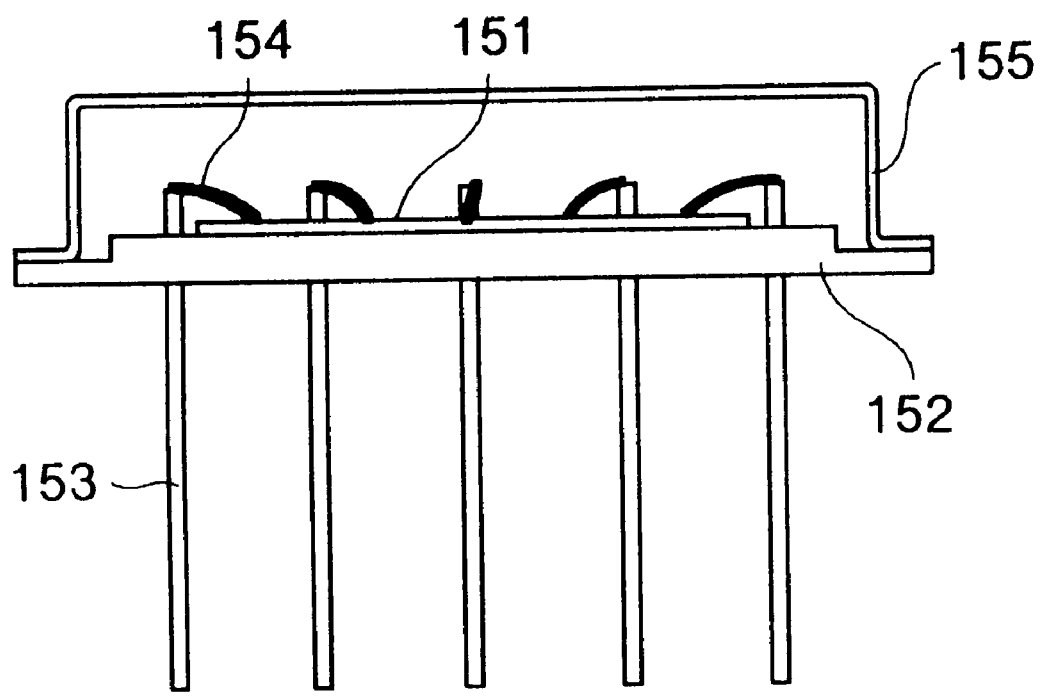
FIG. 10 is a cross section showing surface acoustic wave parts according to an eighth embodiment of the present invention.

FIG. 10 shows the cross section of surface acoustic wave parts according to an eighth embodiment of the present invention. Reference numeral 151 denotes a surface acoustic wave element according to the present invention (or the element disclosed in conjunction with the first to seventh embodiments), numeral 152 denotes a base of a package for holding and fixing the surface acoustic wave element 151 and hermetically sealing the same, numeral 153 denotes lead pins provided in the base 152 so that they are connected to the input, output and ground terminals of the surface acoustic wave element 151 to draw these terminals to the outside of the package, the number of lead pins corresponding to the number of required connections, numeral 154 denotes a wire made of Au, Al or the like for connecting each terminal of the surface acoustic wave element 151 and the corresponding lead pin 153, and numeral 155 denotes a cap welded to the base 152 for hermetically sealing the surface acoustic wave element 151. The hermetical sealing is made while the interior of the package is filled with a nitrogen gas or inert gas. With such a construction, the surface acoustic wave element 151 is isolated from the external environment, thereby avoiding inconveniences including a change of the propagating speed of surface acoustic waves, superfluous reflection of surface acoustic waves and the short circuiting of comb-like electrodes which may be caused from deposition of alien substances on the surface of the surface acoustic wave element 151.

With the use of the surface acoustic wave element of the present invention in the structure shown in FIG. 10, demodulation in the QPSK system becomes possible, thereby making it possible to structure an SS communication system which has a high transmission rate.

The above explanation is made in conjunction with a construction in which the surface acoustic wave element is sealed in a can seal package by wire bonding. However, there is no limitation to the form of sealing and mounting of the surface acoustic wave element. The present invention can be embodied in a sealing and mounting arrangement form having a required construction, for example, a construction in which the surface acoustic wave element is sealed by a ceramic package, mold package or the like or a construction in which the package and the substrate are connected by a flip chip, TAB or the like.

(Embodiment 9)

FIG. 13A is a pattern diagram showing a surface acoustic wave matched filter according to a ninth embodiment of the present invention. The number of pairs of electrodes in a comb-like electrode pair group of the encoding electrode is bigger than one in order to improve the element output. In FIG. 13A, reference numeral 411 denotes a piezoelectric substrate made of quartz crystal, $LiNbO_3$ or the like, numeral 412 denotes a signal input encoding electrode, numeral 413 denotes a matched filter output electrode, numeral 414 denotes an earth pattern for reducing noises, and numeral 415 denotes an acoustic material member for absorbing unnecessary surface acoustic waves. The signal input encoding electrode 412, which converts for converting an electric signal into surface acoustic waves, and the matched filter output electrode 413 which is separated from the signal input encoding electrode 412 by a predetermined interval and which converts the surface acoustic waves into an electric signal, are provided on the piezoelectric substrate 411 to form a surface acoustic wave matched filter. In the case where a PN code series of n bits is used, the signal input encoding electrode 412 has n groups of electrode pairs corresponding to the n-bit PN code series and the groups of comb-like electrode pairs are formed at intervals corresponding to a chip rate. Also, the earth pattern 114 for reducing noises is formed around the signal input encoding electrode 412 and the matched filter output electrode 413, as required. Further, the acoustic material members 415 are formed outside of the signal input encoding electrode 412 and the matched filter output electrode 413 for the purpose of absorbing unnecessary surface acoustic waves, as required. In this case, the signal input encoding electrode 412 and the matched filter output electrode 413 may be reversed, that is, the signal input encoding electrode 412 and the matched filter output electrode 413 may be used as an output electrode and an input electrode, respectively.

In FIG. 13A, the respective ground side terminals of the encoding electrode and the comb-like electrode formed on the same substrate and the earth pattern provided as required are formed as one common pattern, thereby providing each ground terminal and the earth pattern in common with each other. With this construction, the element area can be reduced by about 15% in terms of pattern size as compared with that in the conventional construction. The element output deteriorates as the overlapped length of the electrode fingers becomes small. In the present invention, however, the overlapped length is the same and it is therefore possible to make the size of the element small without deteriorating the element output. Also, the conventional construction requires connections to the sealing package at six locations in total, including four locations for all terminals of respective electrodes and two locations for an earth pattern. In the present embodiment, four locations in total, including two locations for the input/output terminals and two locations for one common ground pattern are sufficient for the connection to the sealing package, thereby making it possible to reduce the number of connections.

FIG. 13B is a pattern diagram showing a composite surface acoustic wave matched filter according to the present invention. The number of pairs of electrodes in a comb-like electrode pair group of the encoding electrode is bigger than one in order to improve the element output. In FIG. 13B, reference numeral 411 denotes a piezoelectric substrate made of quartz crystal, LiNbO$_3$ or the like, numeral 412 denotes a signal input encoding electrode, numeral 413 denotes a matched filter output electrode, numeral 416 denotes a delay line output electrode, numeral 414 denotes an earth pattern for reducing noises, and numeral 415 denotes an acoustic material members for absorbing unnecessary surface acoustic waves. The signal input encoding electrode 412, which converts an electric signal into surface acoustic waves, and the matched filter output electrode 413, which is separated from the signal input encoding electrode 412 by a predetermined interval which converts the surface acoustic waves into an electric signal, are provided on the piezoelectric substrate 411 to form a surface acoustic wave matched filter. Further, the delay line output electrode 416, which is separated from the matched filter output electrode 413 by an interval corresponding to a predetermined delay amount and which converts the surface acoustic waves into an electric signal, is provided on the piezoelectric substrate 411 to form a surface acoustic wave delay line. In the case where a PN code series of n bits is used, the signal input encoding electrode 412 has n groups of comb-like electrode pairs corresponding to the n-bit PN code series and the comb-like electrode pair groups are formed at intervals corresponding to the chip rate. Also, the earth pattern 414 for reducing noises is formed around the signal input encoding electrode 412, the matched filter output electrode 413 and the delay line output electrode 416, as required. For the purpose of absorbing unnecessary surface acoustic waves, the acoustic material members 415 are formed outside of the signal input encoding electrode 412 and the delay line output electrode 416, as required. In this case, there may be employed a construction in which the signal input encoding electrode 412 uses a usual comb-like electrode while each of the matched filter output electrode 413 and the delay line output electrode 416 uses an encoding electrode.

In FIG. 13B, the respective ground side terminals of the encoding electrode and the comb-like electrodes (formed on the same substrate) and the earth pattern (provided as required) are formed as one common pattern, thereby providing each ground terminal and the earth pattern in common with each other. With this construction, the element area can be reduced by about 15% in terms of pattern size as compared with that in the conventional construction. The element output deteriorates as the overlapped length of electrode fingers becomes small. In the present invention, however, the overlapped length is the same and it is therefore possible to make the size of the element small without deteriorating the element output. Also, the conventional construction requires connections to the sealing package at eight locations in total, including six locations for all terminals of the respective electrodes and two locations for an earth pattern. In the present embodiment, five locations in total including three locations for the input/output terminals and two locations for one common ground pattern, are sufficient for the connection to the sealing package, thereby making it possible to reduce the number of connections.
(Embodiment 10)

Figure 14:
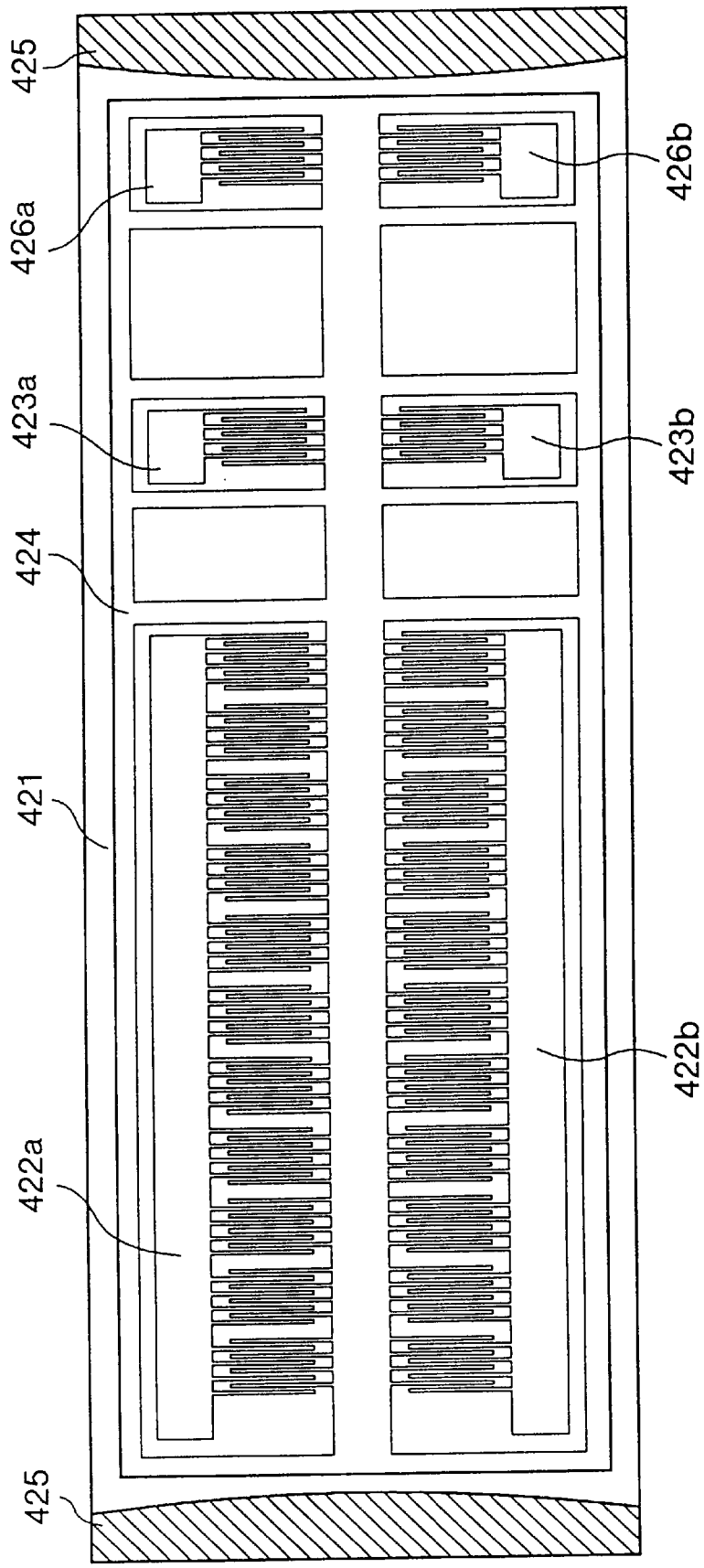
FIG. 14 is a pattern diagram showing a composite surface acoustic wave matched filter according to a tenth embodiment of the present invention.

FIG. 14 is a pattern diagram showing a composite surface acoustic wave matched filter according to a tenth embodiment of the present invention. The number of pairs of electrodes in a comb-like electrode pair group of the encoding electrode is bigger than one in order to improve the element output. In FIG. 14, reference numeral 421 denotes a piezoelectric substrate made of quartz crystal, LiNbO$_3$ or the like, numerals 422a and 422b denote signal input encoding electrodes, numerals 423a and 423b denote matched filter output electrodes, numerals 426a and 426b denote delay line output electrodes, numeral 424 denotes an earth pattern for reducing noises, and numeral 425 denotes an acoustic material member for absorbing unnecessary surface acoustic waves. The signal input encoding electrodes 422a and 422b convert for converting electric signals into surface acoustic waves and the matched filter output electrodes 423a and 423b which have a comb form and are separated from the signal input encoding electrodes 422a and 422b by predetermined intervals, converts the surface acoustic waves into electric signals. These electrodes are provided on the piezoelectric substrate 421 to form surface acoustic wave matched filters. Further, the delay line output electrodes 426a and 426b, which have a comb form and are separated from the matched filter output electrodes 423a and 423b by intervals corresponding to predetermined delay amounts, convert the surface acoustic waves into electric signals and are provided on the piezoelectric substrate 421 to form surface acoustic wave delay lines. In the case where a PN code series of n bits is used, the signal input encoding electrode 422 has n groups of comb-like electrode pairs corresponding to the n-bit PN code series and the groups of comb-like electrode pairs are formed at intervals corresponding to the chip rate. Also, the earth pattern 424 for reducing noises is formed around the input and output electrodes 422a, 422b, 423a, 423b, 426a and 426b, as required. In the case of the present embodiment, a part of the earth pattern 424 can be extended in the propagation direction of surface acoustic waves to reduce the reflecting components of surface acoustic waves. For the purpose of absorbing unnecessary surface acoustic waves, the acoustic material members 425 are formed outside of the input and output electrodes 422a, 422b, 426a and 426b, as required. In this case, there may be employed a construction in which each of the signal input encoding electrodes 422a and 422b uses a comb-like electrodes while each of the matched filter output electrodes 423a and 423b and the delay line output electrodes 426a and 426b uses an encoding electrode.

In FIG. 14, the respective ground side terminals of the encoding electrodes and the comb-like electrodes (formed on the same substrate) and the earth pattern (provided as required) are formed as one common pattern, thereby providing each ground terminal and the earth pattern in common with each other. With this construction, the element area can be reduced by about 30% in terms of pattern size as compared with that in the conventional construction. The element output deteriorates as the overlapped length of electrode fingers becomes small. In the present invention, however, the overlapped length is the same and it is therefore possible to make the size of the element small without deteriorating the element output. Also, the conventional construction requires connections to the sealing package at sixteen locations in total, including twelve locations for all terminals of the respective electrodes and four locations for an earth pattern. In the present embodiment, ten locations in total, including six locations for the input/output terminals and four locations for one common ground pattern, are sufficient for the connection to the sealing package, thereby making it possible to reduce the number of connections. Further, since all connection terminals are provided outside of the element, as shown in FIG. 14, the formation of bumps is facilitated in the case of a flip chip mounting or packaging.

The above explanation is made in conjunction with an example of a construction in which two composite surface acoustic wave matched filters are arranged in parallel. However, there is no limitation to the number of matched filters to be formed on the same substrate, the kind of codes, the chip rate, the number of delay lines, the amount of delay, and the sense or direction of arrangement. The present invention can be embodied in a surface acoustic wave element having a construction in which two or more composite surface acoustic wave matched filters are arranged in parallel or series, a construction in which the electrode patterns or chip rates of respective encoding electrodes are different, or a construction in which the delay amounts of delay lines are different.

(Embodiment 11)

Figure 15:
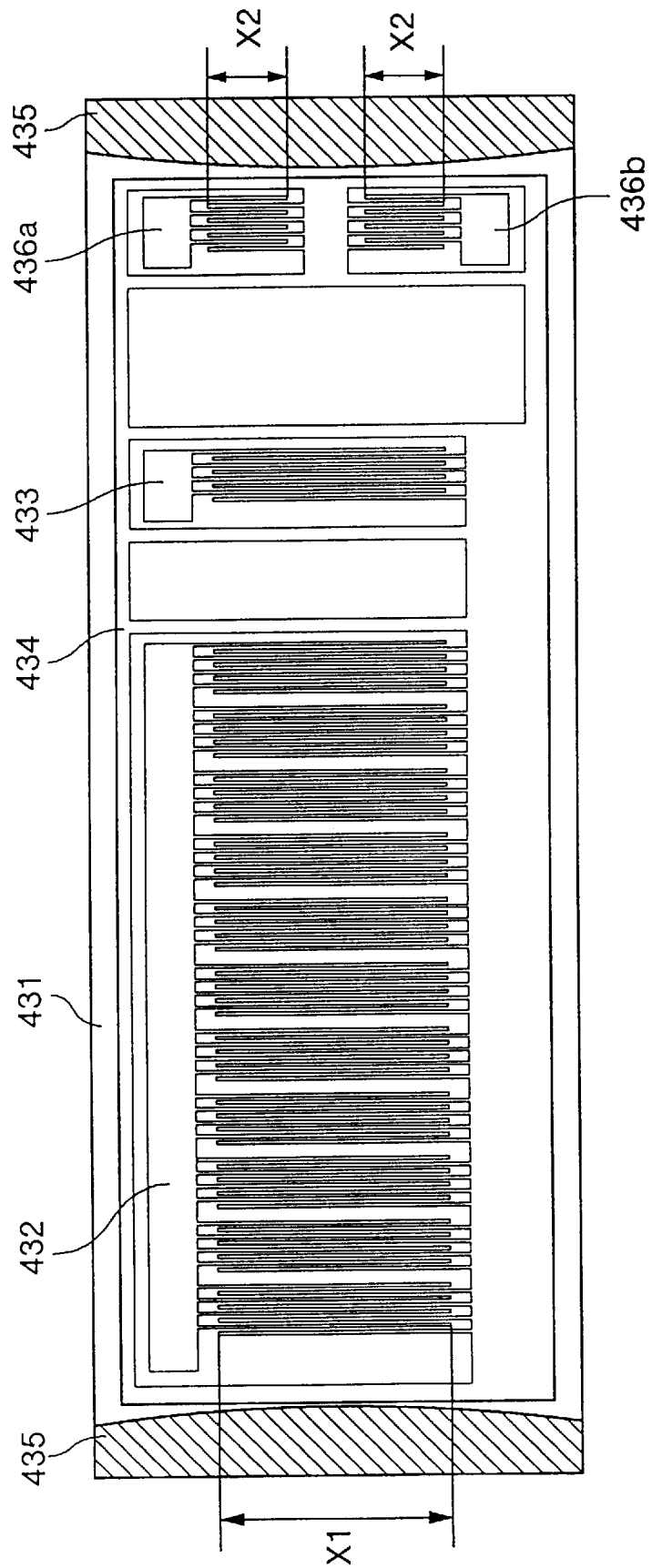
FIGS. 15 and 16 each shows a pattern diagram showing a composite surface acoustic wave matched filter according to an eleventh embodiment of the present invention.

FIG. 15 is a pattern diagram showing a composite surface acoustic wave matched filter according to an eleventh embodiment of the present invention. The number of pairs of electrodes in a comb-like electrode pair group of the encoding electrode is bigger than one in order to improve the element output. In FIG. 15, reference numeral 431 denotes a piezoelectric substrate made of quartz crystal, $LiNbO_3$ or the like, numeral 432 denotes a signal input encoding electrode, numeral 433 denotes a matched filter output electrode, numerals 436a and 436b denotes delay line output electrodes, numeral 434 denotes an earth pattern for reducing noises, and numeral 435 denotes an acoustic material member for absorbing unnecessary surface acoustic waves. The signal input encoding electrode 432 converts an electric signal into surface acoustic waves and the matched filter output electrode 433 which has a comb form and is separated from the signal input encoding electrode 432 by a predetermined interval, converts the surface acoustic waves into an electric signal. These electrodes are provided on the piezoelectric substrate 431 to form a surface acoustic wave matched filter. Further, the delay line output electrodes 436a and 436b, which have a comb form and are separated from the matched filter output electrode 433 by intervals corresponding to predetermined delay amounts, converts the surface acoustic waves into electric signals, and are provided on the piezoelectric substrate 431 to form surface acoustic wave delay lines. In the case where a PN code series of n bits is used as a code series, the signal input encoding electrode 432 has n groups of comb-like electrode pairs corresponding to the n-bit PN code series and the comb-like electrode pair groups are formed at intervals corresponding to the chip rate. Also, the earth pattern 434 for reducing noises is formed around the signal input encoding electrode 432, the matched filter output electrode 433 and the delay line output electrodes 436a and 436b, as required. In the case of the present embodiment, a part of the earth pattern 434 can be extended in the propagation direction of surface acoustic waves to reduce the reflecting components of surface acoustic waves. For the purpose of absorbing unnecessary surface acoustic waves, th e acoustic material members 435 are formed outside of the signal input encoding electrode 432 and the delay line output electrodes 436a and 436b, as required.

Figure 16:
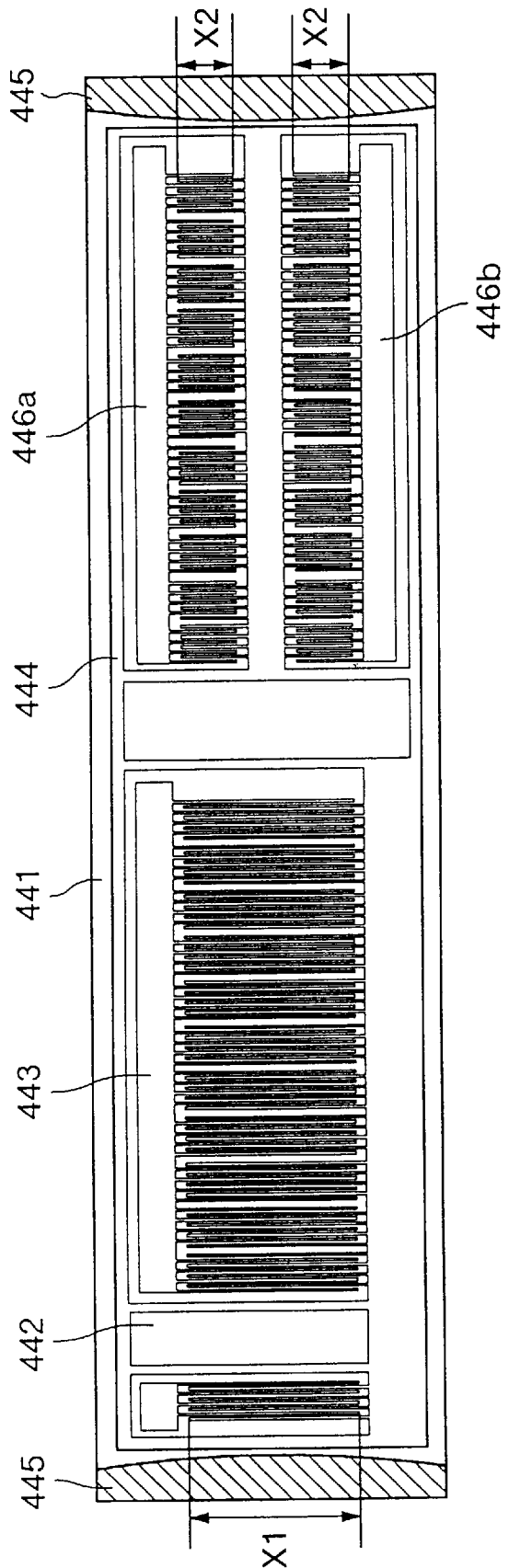

In this case, there may be employed a construction, as shown in FIG. 16, in which a signal input electrode 442 uses the usual comb-like electrode structure while each of an matched filter output electrode 443 and delay line output electrodes 446a and 446b uses an encoding electrode. In FIG. 15, there is used a construction in which two matched filter portions shown in FIG. 14 are united, and the overlapped length X1 of the electrode fingers in the united matched filter is larger than the overlapped length X2 of the electrode fingers of each of the two comb-like electrodes for delay lines having a common ground side terminal. Furthermore, the respective ground side terminals of the encoding electrode and the comb-like electrodes (formed on the same substrate) and the earth pattern ar e formed as one common pattern. With such a construction, the overlapped length of the electrode fingers of the matched filter input and output electrodes becomes two or more times as large as that in the construction shown in FIG. 14, thereby providing an output from the matched filter output electrode 433 that is larger by about two times without enlarging the element area. This is advantageous for the demodulation of an SS signal.

In FIGS. 15 and 16, the respective ground side terminals of the encoding electrode and the comb-like electrodes (formed on the same substrate) and the earth pattern (provided as required) are formed as one common pattern, thereby providing each ground terminal and the earth pattern in common with each other. With this construction, the element area can be reduced by about 30% in terms of pattern size as compared with that in the conventional construction. The element output deteriorates as the overlapped length of electrode fingers becomes small. In the present invention, however, the overlapped length X2 is the same and it is therefore possible to make the size of the element small without deteriorating the element output. Also, the conventional construction requires connections to the sealing package at twelve locations in total, including eight locations for all terminals of the respective electrodes and four locations for an earth pattern. In the present embodiment, eight locations in total, including four locations for the input/output terminals and four locations for one common ground pattern, are sufficient for the connection to the sealing package, thereby making it possible to reduce the number of connections.

In FIG. 15 or 16, the matched filter output electrode 433 or 443 may be divided in a manner similar to the delay line output electrodes 436a and 436b or 446a and 446b.

The above explanation is made in conjunction with an example of a construction which includes one surface acoustic wave matched filter and two delay lines arranged in parallel. However, there is no limitation to the number of matched filters to be formed on the same substrate, the kind of codes, the chip rate, the number of delay lines, the amount of delay, and the sense or direction of arrangement. The present invention can be embodied in a surface acoustic wave element having a construction which includes one surface acoustic wave matched filter and three or more delay lines arranged in parallel or series, a construction in which the electrode patterns or chip rates of respective encoding electrodes are different, or a construction in which the delay amounts of delay lines are different.

(Embodiment 12)

Figure 17:
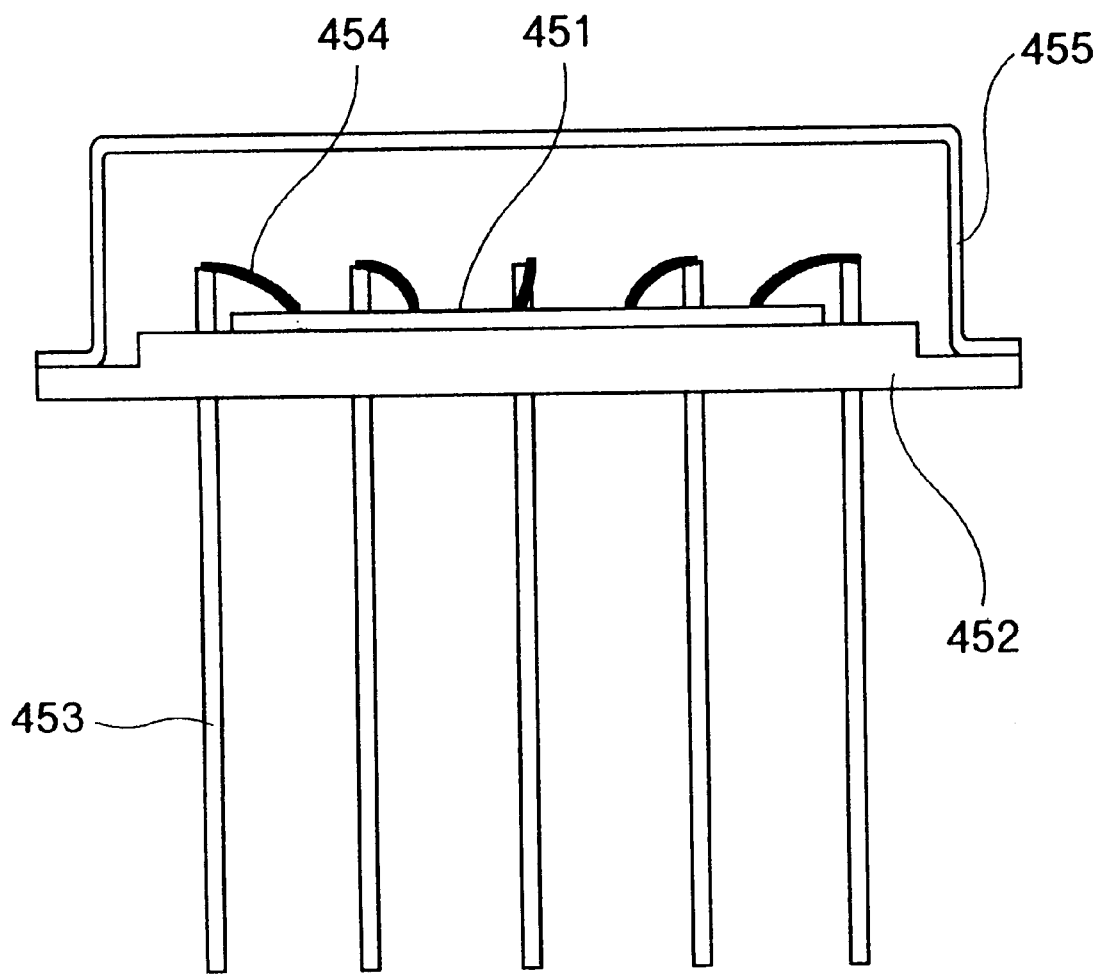
FIG. 17 is a cross section showing surface acoustic wave parts according to a twelfth embodiment of the present invention.

FIG. 17 shows the cross section of surface acoustic wave parts according to a twelfth embodiment of the present invention. In FIG. 17, reference numeral 451 denotes a surface acoustic wave element according to the present invention (for example, the element disclosed in conjunction with the ninth to eleventh embodiments), numeral 452 denotes a base of a package for holding and fixing the surface acoustic wave element 451 and hermetically sealing the same, numeral 453 denotes lead pins provided in the base 452 so that they are connected to the input, output and ground terminals of the surface acoustic wave element 451 to draw these terminals to the outside of the package, the number of lead pins corresponding to the number of required connections, numeral 454 denotes a wire made of Au, Al or the like for connecting each terminal of the surface acoustic wave element 451 and the corresponding lead pin 453, and numeral 455 denotes a cap welded to the base 452 for hermetically sealing the surface acoustic wave element 451. With such a construction, the surface acoustic wave element 451 is isolated from the external environment, thereby avoiding inconveniences including a change of the propagating speed of surface acoustic waves, superfluous reflection of surface acoustic waves and the short circuiting of comb-like electrodes which may be caused from alien substances deposited on the surface of the surface acoustic wave element 451. A space having the surface acoustic wave element 451 sealed therein is filled with nitrogen gas or one or more inert gases (helium, neon and so forth).

With the use of the surface acoustic wave element of the present invention in the structure shown in FIG. 17, it is possible to reduce the area of the base since the area of the element according to the present invention is small as compared with that of the conventional element. Also, since the number of terminals to be connected to the lead pins is small, it is possible to reduce the number of lead pins and the number of connections to the lead pins. These effects reduce the size and cost of the surface acoustic wave parts.

The above explanation is made in conjunction with a construction in which the surface acoustic wave element is sealed in a can seal package by wire bonding. However, there is no limitation to the form of sealing and mounting of the surface acoustic wave element. The present invention can be embodied in a sealing and mounting arrangement having, for example, a construction in which the surface acoustic wave element is sealed by a ceramic package, a mold package or the like, or a construction in which the package and the substrate are connected by a flip chip, TAB or the like.

(Embodiment 13)

Figure 18:
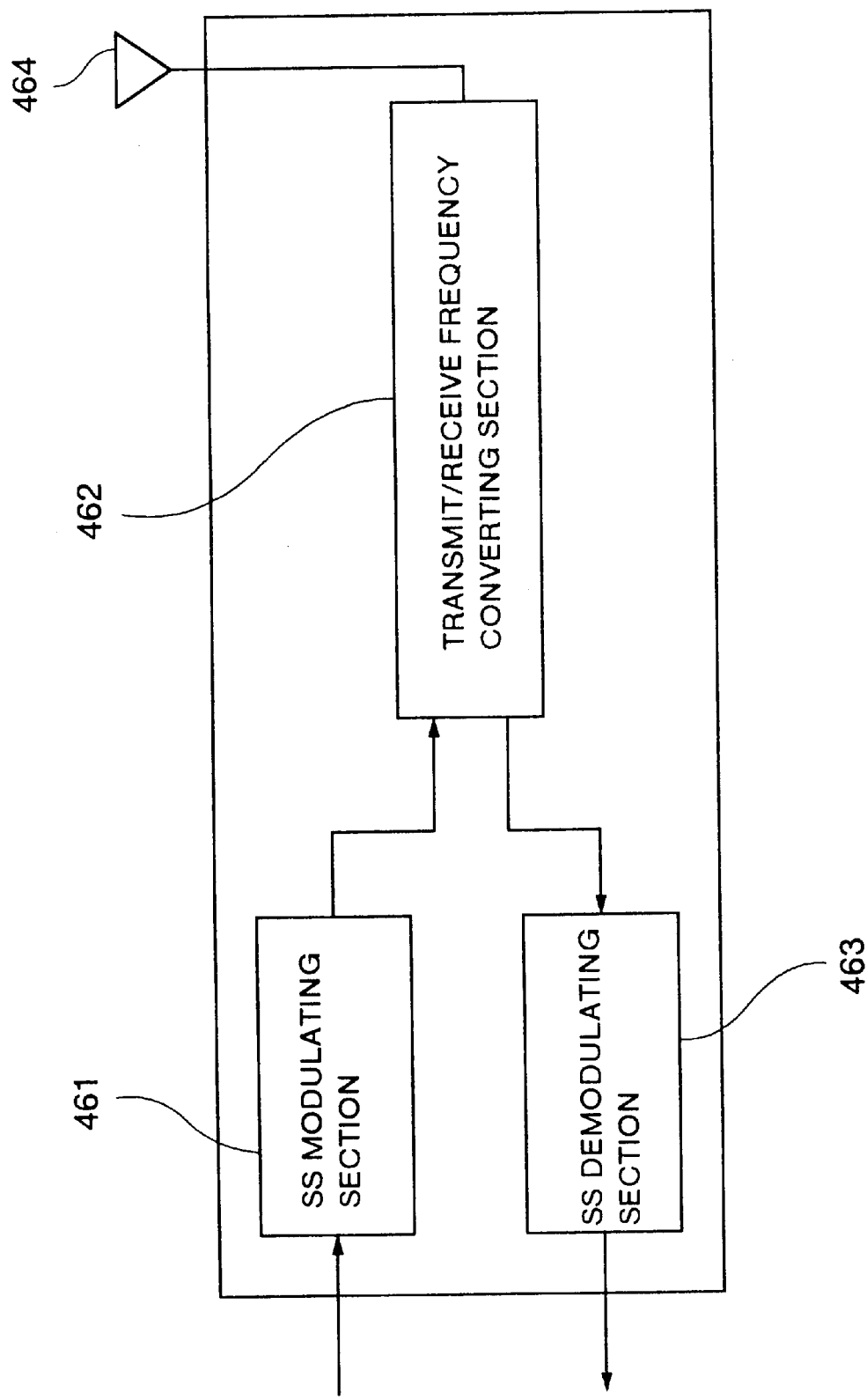
FIG. 18 is a block diagram showing a spread spectrum communication apparatus according to a thirteenth embodiment of the present invention.

FIG. 18 is a block diagram showing a spread spectrum communication apparatus according to a thirteenth embodiment of the present invention. In FIG. 18, reference numeral 461 denotes an SS modulating section for converting data to be transmitted into an SS signal using a predetermined code series, numeral 462 denotes a transmit/receive frequency converting section for making a conversion in frequency between the SS signal and a transmit/receive signal, numeral 463 denotes an SS demodulating section for demodulating an SS signal into the original data, the SS demodulating section including surface acoustic wave parts according to the present invention (for example, the surface acoustic wave parts disclosed in conjunction with the twelfth embodiment), and numeral 464 denotes an antenna for transmitting and receiving a signal.

With the use of the surface acoustic wave parts of the present invention in the construction shown in FIG. 18, the SS demodulating section 463 can be constructed with a small size and at a low cost since the size and cost of the surface acoustic wave parts according to the present invention are reduced as compared with those of the conventional parts. As a result, the spread spectrum communication apparatus can be constructed with a small size and at a low cost.

Though the construction of one transceiver using one transmit/receive frequency converting section is explained above, the present invention is not limited to such a circuit construction. The present invention can be embodied in a spread spectrum communication apparatus inclusive of the SS demodulating section 463 having a required construction such as a construction in which the frequency converting section is divided into a part for transmission and a part for reception or a construction in which a transmitter and a receiver are separated.

(Embodiment 14)

Figure 19A:
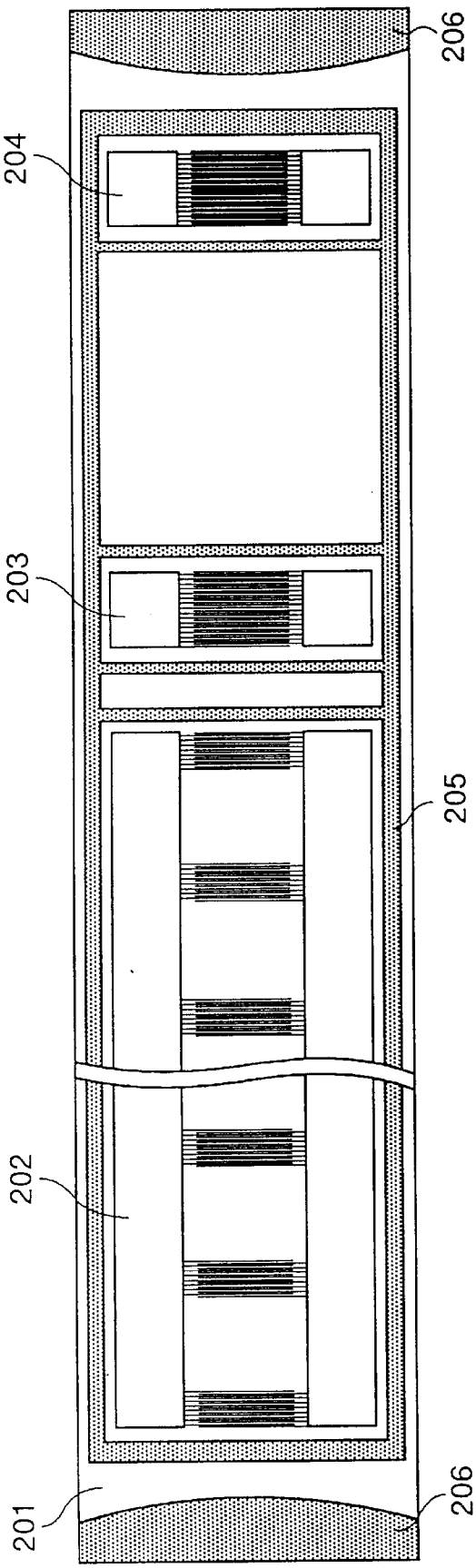
FIG. 19A is a pattern diagram showing a surface acoustic wave element according to a fourteenth embodiment of the present invention.

FIG. 19A shows a surface acoustic wave element according to a fourteenth embodiment of the present invention. In the figure, reference numeral 201 denotes a piezoelectric substrate made of quartz crystal, $LiNbO_3$ or the like, numeral 202 denotes a signal input encoding electrode made of Al, Au or the like, numeral 203 denotes a first output comb-like electrode made of Al, Au or the like, numeral 204 denotes a second output comb-like electrode made of Al, Au or the like, numeral 205 denotes an earth pattern made of Al, Au or the like, and numeral 206 denotes an acoustic material member for absorbing unnecessary surface acoustic waves. The signal input encoding electrode 202 converts an electric signal into surface acoustic waves. The first output comb-like electrode 203 is separated from the input encoding electrode 202 by a predetermined interval and converts the surface acoustic waves into an electric signal. The second output comb-like electrode 204 is separated from the first output comb-like electrode 203 by one period of an information signal and converts the surface acoustic waves into an electric signal. These electrodes are provided on the piezoelectric substrate 201 to form a surface acoustic wave element. In the case where a PN code series of i bits is used, the input encoding electrode 202 has i groups of comb-like electrode pairs corresponding to the i-bit PN code series and the comb-like electrode pair groups are formed at intervals corresponding to the chip rate. Also, the earth pattern 205 for reducing noises is formed around the input and output electrodes 202, 203 and 204, as required. For the purpose of absorbing unnecessary surface acoustic waves, the acoustic material members 206 are formed outside of the input and output electrodes 202 and 204, as required.

Figure 19B:
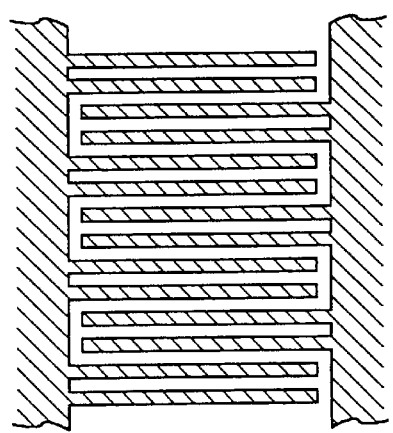
FIG. 19B shows the details of an output comb-like electrode used in the surface acoustic wave element shown in FIG. 19A.

The input encoding electrode 202 has a single-electrode structure. The second output comb-like electrode 204 has a double-electrode structure, as shown in FIG. 19B.

When the number of pairs of electrode fingers in a comb-like electrode pair group of the input encoding electrode corresponding to each bit is selected such that it greater than 1 and equal to or smaller than the ratio of the carrier frequency that is used to the chip rate that is used, an electric signal can be converted into surface acoustic waves at a high efficiency, thereby obtaining a surface acoustic wave element which has a high efficiency. In the case of the present embodiment, the carrier frequency is 286 MHz and the chip rate is 11 MHz. Therefore, the number of pairs of electrode fingers in the comb-like electrode pair group corresponding to one code bit can be selected to a value between 2 and 26. The present embodiment shows the case where the number of pairs is 8. In this case, the efficiency is improved by about 18 dB.

As the number of pairs of electrode fingers in the comb-like electrode pair becomes greater, the efficiency is enhanced. However, the area of electrodes for the substrate is correspondingly increased. Therefore, the influence of dust or the like at the time of processing becomes large. Especially, if the encoding electrode is provided with a double-electrode structure, the influence is further increased since the width of the electrode fingers is narrowed. Accordingly, it is preferable from the aspect of processing that the encoding electrode is provided with a single-electrode structure.

Figure 20:
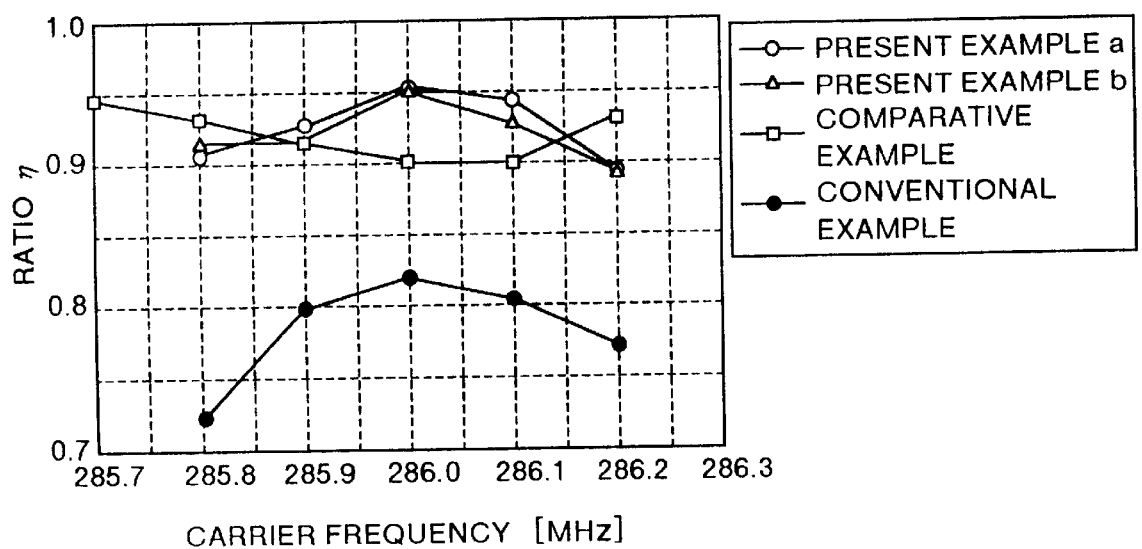
FIG. 20 is a graph showing the relationship between a carrier frequency and the variations of a correlation output.

Table 1 shows the structure of each of the electrodes in examples of the present embodiment, a comparative example and the conventional example, and FIG. 20 shows the results of comparison between those examples.

TABLE 1

|  | ENCODING ELECTRODE | FIRST OUTPUT ELECTRODE | SECOND OUTPUT ELECTRODE |
|---|---|---|---|
| PRESENT EXAMPLE a | SINGLE-ELECTRODE | SINGLE-ELECTRODE | DOUBLE-ELECTRODE |
| PRESENT EXAMPLE b | SINGLE-ELECTRODE | DOUBLE-ELECTRODE | DOUBLE-ELECTRODE |
| COMPARATIVE EXAMPLE | DOUBLE-ELECTRODE | DOUBLE-ELECTRODE | DOUBLE-ELECTRODE |
| CONVENTIONAL EXAMPLE | SINGLE-ELECTRODE | SINGLE-ELECTRODE | SINGLE-ELECTRODE |

In FIG. 20, the abscissa represents the carrier frequency and the ordinate represents a ratio η between the maximum and minimum values of a correlation output of the first output comb-like electrode in the case where an input signal is "11110". It is apparent from FIG. 20 that the examples a and b of the present embodiment have the ratio η of 0.95 and are therefore superior to the conventional example. This is because the effect of reflected surface acoustic waves from the second output comb-like electrode 204 at the first output comb-like electrode 203 is suppressed by constructing the second output comb-like electrode 204 with a double-electrode structure. In the case of the comparative example in which all electrodes are double-electrode structures, the tendency of η for the carrier frequency is reversed with respect to the examples of the present embodiment, that is, the ratio η shows a tendency to decrease at the carrier frequency (286 MHz) that is used.

As will be apparent from the above, the present embodiment provides an excellent effect that in a high-efficiency surface acoustic wave element having an increased number of pairs of electrode fingers in a comb-like electrode pair structure, a deterioration of the yield at the time of processing is avoided by providing the input encoding electrode with a single-electrode structure and variations of a correlation output can be suppressed by providing the output comb-like electrode arrangement with a double-electrode structure.

There is no special limitation to the structure of the comb-like electrode. A similar effect can also be provided by a weighted structure such as an apodized electrode other than the normalized electrode shown in the present embodiment.

The signal input encoding electrode 202 and the output electrodes 203 and 204 may be reversed in such a manner that a comb-like electrode is used as the signal input encoding electrode while an encoding electrode is used as the output electrode. In this case, however, since the encoding electrode used as the output electrode is provided with a double-electrode structure, an excellent value as the ratio η can be obtained but the influence originating from processing is generated.

(Embodiment 15)

Figure 21:
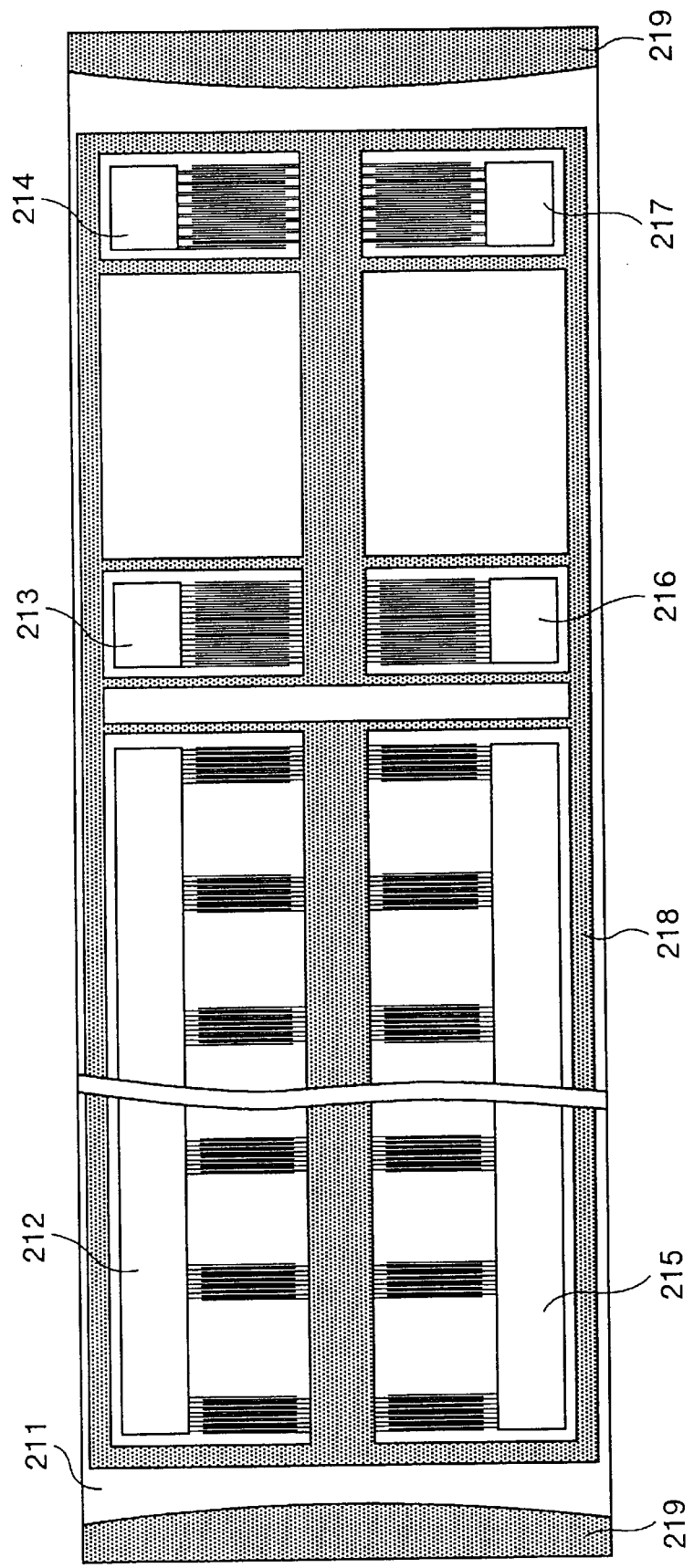
FIG. 21 is a pattern diagram showing a composite surface acoustic wave element according to a fifteenth embodiment of the present invention.

FIG. 21 shows a composite surface acoustic wave element according to a fifteenth embodiment of the present invention. Two surface acoustic wave elements are arranged on the same piezoelectric substrate. In order to reduce the size of the element, each ground side terminal and an earth pattern are provided in common with each other. In FIG. 21, reference numeral 211 denotes a piezoelectric substrate made of quartz crystal, LiNbO₃ or the like, numerals 212 and 215 denote signal input encoding electrodes made of Al, Au or the like, numerals 213 and 216 denote first and third output comb-like electrodes made of Al, Au or the like, numerals 214 and 217 denote second and fourth output comb-like electrodes made of Al, Au or the like, numeral 218 denotes an earth pattern made of Al, Au or the like, and numeral 219 denotes an acoustic material member for absorbing unnecessary surface acoustic waves.

The signal input encoding electrode 212 (for converting an electric signal into surface acoustic waves), the first output comb-like electrode 213 (which is separated from the signal input encoding electrode 212 by a predetermined interval and which converts the surface acoustic waves into an electric signal), and the second output comb-like electrode 214 (which is separated from the first output comb-like electrode 213 by a predetermined interval and which converts the surface acoustic waves into an electric signal) are provided on the piezoelectric substrate 211 to form one surface acoustic wave element. The signal input encoding electrode 215 (for converting an electric signal into surface acoustic waves), the third output comb-like electrode 216 (which is separated from the signal input encoding electrode 215 by a predetermined interval and which converts the surface acoustic waves into an electric signal), and the fourth output comb-like electrode 217 (which is separated from the third output comb-like electrode 216 by a predetermined interval and which converts the surface acoustic waves into an electric signal) are provided on the same piezoelectric substrate 211 to form the other surface acoustic wave element. Also, the earth pattern 218 for reducing noises is formed around the signal input and output electrodes. In the case of the present embodiment, the ground terminals of the input and output electrodes and the earth pattern are provided in common with each other to reduce the element size. For the purpose of absorbing unnecessary surface acoustic waves, the acoustic material members 219 are formed outside of the input and output electrodes 212, 214, 215 and 217, as required.

In the present embodiment too, when the number of pairs of electrode fingers in a comb-like electrode pair group of the input encoding electrodes 212 and 215 corresponding to each bit is greater than 1 and equal to or smaller than the ratio of the used carrier frequency that is used to the chip rate that is used, it is possible to convert an electric signal into surface acoustic waves at a high efficiency, thereby obtaining a surface acoustic wave element which has a high efficiency.

Each of the input encoding electrodes 212 and 215 is provided with a single-electrode structure and each of at least the second and fourth output comb-like electrodes 214 and 217 is provided with a double-electrode structure, thereby obtaining an effect similar to that in the fourteenth embodiment.

There is no special limitation to the structure of the comb-like electrode. A similar effect can also be provided by a weighted structure such as an apodized electrode other than the normalized electrode shown in the present embodiment.

The above surface acoustic wave element can take a free construction in a scope which does not depart from the significance of the present invention. Such a construction may include a structure in which the interval between the first output electrode 213 and the second output electrode 214 and the interval between the third output electrode 216 and the fourth output electrode 217 are made different from each other to provide a surface acoustic wave element for the QPSK system, and a structure in which the codes of the input encoding electrodes 212 and 215 correspond to different spread codes or different chip rates.

It is possible to reverse the signal input encoding electrode 212 and the output electrodes 213 and 214 and to reverse the signal input encoding electrode 215 and the output electrodes 216 and 217 in such a manner that a comb-like electrode is used as the signal input electrode while an encoding electrode is used as the output electrode. In this case, however, since the encoding electrode used as the output electrode is provided with a double-electrode structure, an excellent value as the ratio η can be obtained but the influence originating from processing is generated.

(Embodiment 16)

Figure 22:
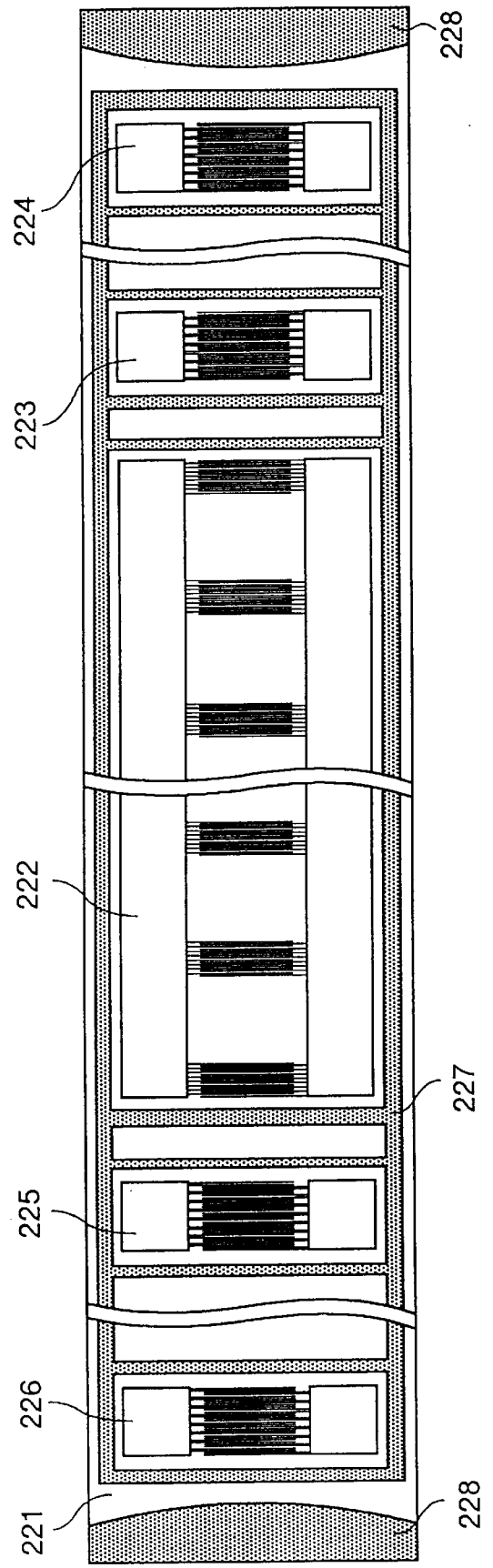
FIG. 22 is a pattern diagram showing a composite surface acoustic wave element according to a sixteenth embodiment of the present invention.

FIG. 22 shows a surface acoustic wave element according to a sixteenth embodiment of the present invention. In FIG. 22, reference numeral 221 denotes a piezoelectric substrate made of quartz crystal, $LiNbO_3$ or the like, numeral 222 denotes a signal input encoding electrode made of Al, Au or the like, numerals 223, 224, 225 and 226 denote first, second, third and fourth output comb-like electrodes made of Al, Au or the like, numeral 227 denotes an earth pattern made of Al, Au or the like, and numeral 228 denotes an acoustic material member for absorbing unnecessary surface acoustic waves. On the piezoelectric substrate 221 are provided the signal input encoding electrode 222 (for converting an electric signal into surface acoustic waves), the first output comb-like electrode 223 (which is separated from the encoding electrode 222 by a predetermined interval and which converts the surface acoustic waves into an electric signal), the second output comb-like electrode 224 (which is separated from the first output comb-like electrode 223 by a predetermined interval and which converts the surface acoustic waves into an electric signal), the third output comb-like electrode 225 (which is separated from the encoding electrode 222 by a predetermined interval in a direction opposite to the first output comb-like electrode 223 with respect to the encoding electrode 222 and which converts the surface acoustic waves into an electric signal), and the fourth output comb-like electrode 226 (which is separated from the third output comb-like electrode 225 by a predetermined interval and which for converts the surface acoustic waves into an electric signal). Also, the earth pattern 227 for reducing noises is formed around the signal input and output electrodes, as required. For the purpose of absorbing unnecessary surface acoustic waves, the acoustic material members 228 are formed outside of the output electrodes 224 and 226, as required.

When the number of pairs of electrode fingers in a comb-like electrode pair group of the input encoding electrode 222 corresponding to each bit is selected such that it is greater than 1 and equal to or smaller than the ratio of the used carrier frequency to the chip rate, an electric signal can be converted into surface acoustic waves at a high efficiency, thereby obtaining a surface acoustic wave element which has a high efficiency.

The input encoding electrode 222 is provided with a single-electrode structure and each of at least the second and fourth output comb-like electrodes 224 and 226 is provided with a double-electrode structure, thereby obtaining an effect similar to that in the fourteenth embodiment.

There is no special limitation to the structure of the comb-like electrode. A similar effect can also be provided by a weighted structure such as an apodized electrode other than the normalized electrode shown in the present embodiment.

The above surface acoustic wave element can take a free construction in a scope which does not depart from the significance of the present invention. Such a construction may include a structure in which the interval between the first output electrode 223 and the second output electrode 224 and the interval between the third output electrode 225 and the fourth output electrode 226 are made different from each other to provide a surface acoustic wave element for QPSK system.

The signal input encoding electrode 222 and the output electrodes 223, 224, 225 and 226 may be reversed in such a manner that a comb-like electrode is used as the signal input electrode while an encoding electrode is used as the output electrode. In this case, however, since the encoding electrode used as the output electrode is provided with a double-electrode structure, an excellent value as the ratio η can be obtained but the influence originating from processing is generated.

(Embodiment 17)

Figure 23:
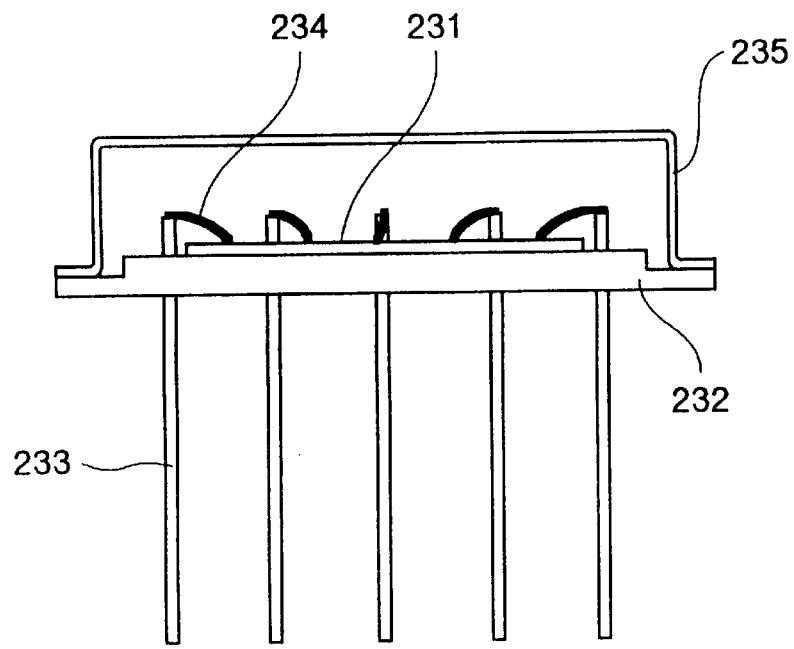
FIG. 23 is a cross section showing surface acoustic wave parts according to a seventeenth embodiment of the present invention.

FIG. 23 shows the cross section of surface acoustic wave parts according to a seventeenth embodiment of the present invention. In FIG. 23, reference numeral 231 denotes a surface acoustic wave element according to the present invention (for example, the element disclosed in conjunction with the thirteenth to sixteenth embodiments), numeral 232 denotes a base of a package for holding and fixing the surface acoustic wave element 231 and hermetically sealing the same, numeral 233 denotes lead pins provided in the base 232 so that they are connected to the input, output and ground terminals of the surface acoustic wave element 231 to draw these terminals to the outside of the package, the number of lead pins corresponding to the number of required connections, numeral 234 denotes a wire made of Au, Al or the like for connecting each terminal of the surface acoustic wave element 231 and the corresponding lead pin 233, and numeral 235 denotes a cap welded to the base 232 for hermetically sealing the surface acoustic wave element 231. The hermetical sealing is made while the interior of the package is filled with nitrogen gas or inert gas. With such a construction, the surface acoustic wave element 231 is isolated from the external environment, thereby avoiding inconveniences including a change of the propagating speed of surface acoustic waves, superfluous reflection of surface acoustic waves and the short circuiting of comb-like electrodes which may be caused from the deposition of alien substances on the surface of the surface acoustic wave element 231.

With the use of the surface acoustic wave element of the present invention in the structure shown in FIG. 23, it is possible to obtain surface acoustic wave parts in which variations of a correlation output are suppressed.

The above explanation is made in conjunction with a construction in which the surface acoustic wave element is sealed in a can seal package by wire bonding. However, there is no limitation to the form of sealing and mounting of the surface acoustic wave element. The present invention can be embodied in a sealing and mounting arrangement having, for example, a construction in which the surface acoustic wave element is sealed by a ceramic package, a mold package or the like, or a construction in which the package and the substrate are connected by a flip chip, TAB or the like.

(Embodiment 18)

Figure 24:
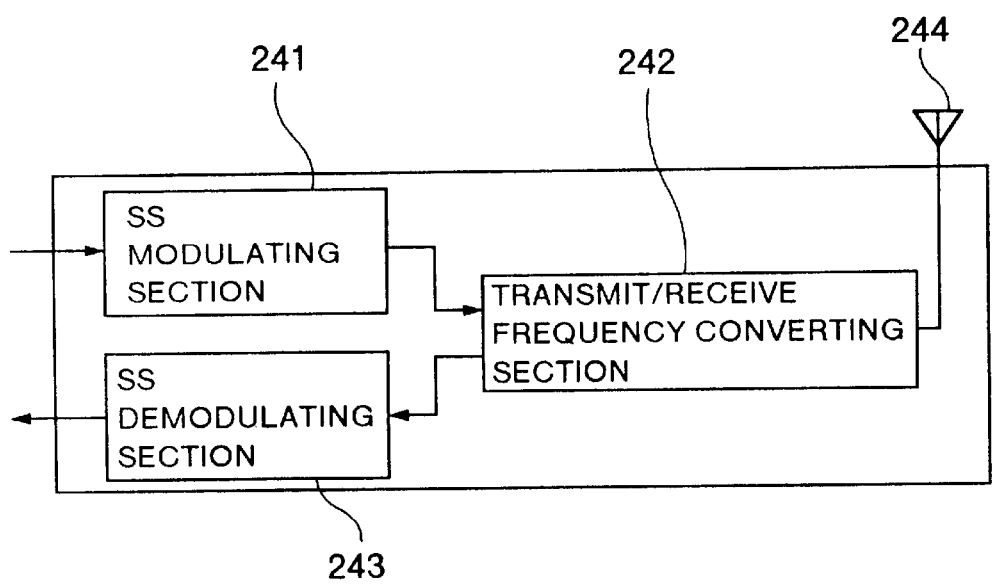
FIG. 24 is a block diagram showing a spread spectrum communication apparatus according to an eighteenth embodiment of the present invention.

FIG. 24 shows a block diagram of a spread spectrum communication apparatus according to an eighteenth embodiment of the present invention. In FIG. 24, reference numeral 241 denotes an SS modulating section for converting data to be transmitted into an SS signal using a predetermined code series, numeral 242 denotes a transmit/receive frequency converting section for making a conversion in frequency between the SS signal and a transmit/receive signal, numeral 243 denotes an SS demodulating section for demodulating an SS signal into the original data, the SS demodulating section including surface acoustic wave parts according to the present invention (for example the surface acoustic wave parts disclosed in conjunction with the seventeenth embodiment), and numeral 244 denotes an antenna for transmitting and receiving a signal.

With the use of the surface acoustic wave parts of the present invention in the construction shown in FIG. 24, variations of a correlation output and hence variations of a demodulated output from an integrating circuit can be suppressed, thereby making it possible to suppress the error rate at the time of demodulation of an information signal.

Though the construction of one transceiver using one transmit/receive frequency converting section is explained in the above, the present invention is not limited to such a circuit construction. The present invention can be embodied in a spread spectrum communication apparatus inclusive of the SS demodulating section having a required construction such as a construction in which the frequency converting section is divided into a part for transmission and a part for reception or a construction in which a transmitter and a receiver are separated.

What is claimed is:

1. A surface acoustic wave element comprising:
   a piezoelectric substrate;
   a signal input encoding electrode formed on said piezoelectric substrate;
   a first output comb-like electrode formed on said piezoelectric substrate at a location that is spaced apart from said signal input encoding electrode by a predetermined interval and
   a second output comb-like electrode formed on said piezoelectric substrate at a location that is spaced apart from said first output comb-like electrode by $T+(\pm n+a/8)/f_c$, T being one period of a signal to be received and demodulated, n being an integral number between 0 and a value twice as large as the ratio of a carrier frequency $f_c$ of a signal inputted to said signal input encoding to a chip rate which is a frequency corresponding to an interval between comb-like electrode pairs or groups of comb-like electrode pairs of said signal input encoding electrode, said comb-like electrode pairs or groups of electrode pairs corresponding to a code series, and a satisfying $½≦a≦3/2$.

2. A surface wave element according to claim 1, wherein said input encoding electrode has groups of comb-like electrode pairs, and wherein the number of pairs of electrodes in a comb-like electrode pair group of said input encoding electrode corresponding to one code bit of said code series is greater than 1 and equal to or smaller than the ratio of said carrier frequency to said chip rate.

3. A spread spectrum communication apparatus according to claim 1, wherein n is not zero.

4. A surface acoustic wave element comprising:
   a piezoelectric substrate;
   a signal input encoding electrode formed on said piezoelectric substrate;
   a first output comb-like electrode formed on said piezoelectric substrate at a location that is spaced apart from said signal input encoding electrode by a predetermined interval; and
   a second output comb-like electrode formed on said piezoelectric substrate at a located that is spaced apart from said first output comb-like electrode by $T+(\pm m-a/8)/f_c$, T being one period of a signal to be received and demodulated, m being an integral number between 0 and a value twice as large as the ratio of a carrier frequency $f_c$ of a signal inputted to said signal input encoding electrode to a chip rate which is a frequency corresponding to an interval between comb-like electrode pairs or groups of comb-like electrode pairs of said signal input encoding electrode, said comb-like electrode pairs or groups of electrode pairs corresponding to a code series, and a satisfying $½≦a≦3/2$.

5. A surface wave element according to claim 4, wherein said input encoding electrode has groups of comb-like electrode pairs, and wherein the number of pairs of electrodes in a comb-like electrode pair group of said input encoding electrode corresponding to one code bit of said code series is greater than 1 and equal to or smaller than the ratio of said carrier frequency to said chip rate.

6. A spread spectrum communication apparatus according to claim 4, wherein m is not zero.

7. Surface acoustic wave parts in which surface acoustic wave elements according to claims 1 or 4 are hermetically sealed.

8. A surface acoustic wave element comprising:
   a piezoelectric substrate;
   a signal input encoding electrode formed on said piezoelectric substrate;
   a first output comb-like electrode formed on said piezoelectric substrate at a location that is spaced apart from said signal input encoding electrode by a predetermined interval; and
   a second output comb-like electrode formed on said piezoelectric substrate at a location that is spaced apart from said first output comb-like electrode by $T+1/f_c/8$, wherein T is one period of a signal to be received and demodulated and $f_c$ is a carrier frequency of a signal inputted to said signal input encoding electrode,
   wherein said input encoding electrode has comb-like electrode pair groups corresponding to a code series, the number of pairs of electrodes in a comb-like electrode pair group of said input encoding electrode corresponding to one code bit of said code series being greater than 1 and equal to or smaller than the ratio of said carrier frequency to a chip rate which is a frequency corresponding to an interval between the comb-like electrode pair groups of said input encoding electrode.

9. A surface acoustic wave comprising:
   a piezoelectric substrate;
   a signal input encoding electrode formed on said piezoelectric substrate;
   a first output comb-like electrode formed on said piezoelectric substrate at a location that is spaced apart from said signal input encoding electrode by a predetermined interval; and
   a second output comb-like electrode formed on said piezoelectric substrate at a location that is spaced apart from said first output comb-like electrode by $T-1/f_c/8$, wherein T is one period of a signal to be received and demodulated and $f_c$ us a carrier frequency of a signal inputted to said signal input encoding electrode, wherein said input encoding electrode has comb-like electrode pair groups corresponding to a code series, the number of pairs of electrodes in a comb-like electrode pair group of said input encoding electrode corresponding to one code bit of said code series being greater than 1 and equal to or smaller than the ratio of said carrier frequency to a chip rate which is a frequency corresponding to an interval between the comb-like electrode pair groups of said input encoding electrode.

10. A surface acoustic wave element comprising:

a piezoelectric substrate;

a signal input comb-like electrode formed on said piezoelectric substrate;

a first output encoding electrode formed on said piezoelectric substrate at a location that is spaced apart from said signal input comb-like electrode by a predetermined interval; and a second output encoding electrode formed on said piezoelectric substrate at a location is spaced apart from said first output encoding electrode by $T+(\pm n+a/8)/f_c$, T being one period of a signal to be received and demodulated, n being an integral number 0 and a value twice as large as the ratio of a carrier frequency $f_c$ of a signal inputted to said signal input comb-like electrode to a chip rate which is a frequency corresponding to an interval between the comb-like electrode pairs or groups of comb-like electrode pairs of said first or second output encoding electrodes, said comb-like electrode pairs or groups of electrode pairs corresponding to a code series, and a satisfying $½ \leq a \leq 3/2$.

11. A surface wave element according to claim 10, wherein said first output encoding electrode has groups of comb-like electrode pairs, and wherein the number of pairs of electrodes in a comb-like electrode pair group of said first output encoding electrode corresponding to one code bit of said code sequence is greater than 1 and equal to or smaller than the ratio of said carrier frequency to said chip rate.

12. A spread spectrum communication apparatus according to claim 10, wherein n is zero.

13. A surface acoustic wave element comprising:

a piezoelectric substrate;

a signal input comb-like electrode formed on said piezoelectric substrate;

a first output encoding electrode formed on said piezoelectric substrate at a location that is spaced apart from said signal input comb-like electrode by a predetermined interval; and a second output encoding electrode formed on said piezoelectric substrate at a location is spaced apart from said first output encoding electrode by $T+(\pm m-a/8)/f_c$, T being one period of a signal to be received and demodulated, m being an integral number between 0 and a value twice as large as the ratio of a carrier frequency $f_c$ of a signal inputted to said signal input comb-like electrode to a chip rate which is a frequency corresponding to an interval between the comb-like electrode pairs or groups of comb-like electrode pairs of said first or second output encoding electrodes, said comb-like electrode pairs or groups of electrode pairs corresponding to first or second output a code series, and a satisfying $½ \leq a \leq 3/2$.

14. A surface wave element according to claim 13, wherein said first output encoding electrode has groups of comb-like electrode pairs, and wherein the number of pairs of electrodes in a comb-like electrode pair group of said first output encoding electrode corresponding to one code bit of said code sequence greater than 1 and equal to or smaller than the ratio of said carrier frequency to said chip rate.

15. A spread spectrum communication apparatus according to claim 13, wherein m is not zero.

16. A surface acoustic wave element comprising:

a piezoelectric substrate;

a signal input encoding electrode formed on said piezoelectric substrate;

a first output comb-like electrode formed on said piezoelectric substrate at a location that is spaced apart from said signal input encoding electrode by a predetermined interval; and a second output comb-like electrode formed on said piezoelectric substrate at a location is spaced apart from said first output comb-like electrode by $T+1/f_c/8$, wherein T is one period of a signal to be received and demodulated and $f_c$ is a carrier frequency of a signal inputted to said signal input comb-like electrode, wherein said first output encoding electrode has comb-like electrode pair groups corresponding to a code series and said second output encoding electrode has a comb-like electrode pair groups corresponding to the same codes series, and wherein the number of pairs of electrodes in a comb-like electrode pair group of said output encoding electrodes corresponding to one code bit of said code series is greater than 1 and equal to or smaller than the ratio of said carrier frequency to a chip rate which is a frequency corresponding to an interval between the comb-like electrode pair groups of said input encoding electrodes.

17. A surface acoustic wave element comprising:

a piezoelectric substrate;

a signal input encoding electrode formed on said piezoelectric substrate;

a first output comb-like electrode formed on said piezoelectric substrate at a location that is spaced apart from said signal input encoding electrode by a predetermined interval; and a second output comb-like electrode formed on said piezoelectric substrate at a location is spaced apart from said first output comb-like electrode by $T+1/f_c/8$, wherein T is one period of a signal to be received and demodulated and $f_c$ is a carrier frequency of a signal inputted to said signal input comb-like electrode, wherein said first output encoding electrode has comb-like electrode pair groups corresponding to a code series and said second output encoding electrode has comb-like electrode pair groups corresponding to the same code series, and wherein the number of pairs of electrodes in a comb-like electrode pair group of said output encoding electrodes corresponding to one code bit of said code series is greater than 1 and equal to or smaller than the ratio of said carrier frequency to a chip rate which is a frequency corresponding to an interval between the comb-like electrode pair groups of said output encoding electrodes.

18. A spread spectrum communication apparatus comprising a demodulating section which includes at least one surface acoustic wave matched filter, two delay means for delaying an output signal of said at least one surface acoustic wave matched filter, and first and second integrating circuits for integrating an output signal of said at least one surface acoustic wave matched filter and the respective output signals of said two delay means, wherein at the time of input to said first and second integrating circuits, the respective outputs of said two delay means are delayed by $T+(\pm n+a/8)/f_c$ and $T+(\pm m-a/8)/f_c$ with respect to the output of said at least one surface acoustic wave matched filter, T being one period of a signal to be received and demodulated, each of n and m being an integral number between 0 and a value twice as large as the ratio of a carrier frequency $f_c$ of a signal inputted to said surface acoustic wave matched filter to a chip rate which is a frequency corresponding to an interval between comb-like electrode pairs or comb-like electrode pair groups of an encoding electrode that is included in one of said delay means or said at least one surface acoustic wave matched filter, said comb-like electrode pairs or pair groups corresponding to a code series, and a satisfying $½ \leq a \leq 3/2$.

19. A spread spectrum communication apparatus according to claim 18, wherein at least one of n or m is not zero.

20. A spread spectrum communication apparatus according to claim 18, wherein n or m are not equal.

21. A spread spectrum communications apparatus comprising a demodulating section which includes:

at least one surface acoustic wave matched filter;

two surface acoustic wave delay lines having delay amounts which are $T+(\pm n+a/8)/f_c$ and $T+(\pm m-a/8)/f_c$, respectively, T being one period of a signal to be received and demodulated, each of n and m being an integral number between 0 and a value twice as large as the ratio of a carrier frequency $f_c$ of a signal inputted to said at least one surface acoustic wave matched filter to a chip rate which is a frequency corresponding to an interval between comb-like electrode pairs or comb-like electrode pair groups of an encoding electrode that is included in one of said two surface acoustic wave delay lines or said at least one surface acoustic wave matched filter, said comb-like electrode pairs or electrode pair groups corresponding to a code series, and a satisfying $½ \leq a \leq 3/2$; and integrating circuit means for integrating an output signal of said at least one surface acoustic wave matched filter and each output signal of said surface acoustic wave delay lines.

22. A spread spectrum communication apparatus according to claim 21, wherein at least one of n or m is not zero.

23. A spread spectrum communication apparatus according to claim 21, wherein n or m are not equal.

24. A surface acoustic wave element comprising:

a piezoelectric substrate;

a signal input comb-like electrode formed on said piezoelectric substrate;

a first output encoding electrode formed on said piezoelectric substrate at a location that is spaced apart from said signal input comb-like electrode by a predetermined interval, said first output encoding electrode having comb-like electrode pair groups corresponding to a code series;

a second output encoding electrode formed on said piezoelectric substrate at a location that is spaced apart from said first output encoding electrode by $T+1/f_c/8$, wherein T is one period of a signal to be received and demodulated and $f_c$ is a carrier frequency of a signal inputted to said signal input comb-like electrode, said second output encoding electrode having comb-like electrode pair groups corresponding to the same code series as that of said first output electrode;

a third output encoding electrode formed on said piezoelectric substrate at a location that is spaced apart from said signal input comb-like electrode by a predetermined interval in a direction opposite to said first output encoding electrode with respect to said signal input comb-like electrode, said third output encoding electrode having comb-like electrode pair groups corresponding to a code series which is symmetrical to that of said first output encoding electrode with respect to said signal input comb-like electrode; and a fourth output encoding electrode formed on said piezoelectric substrate at a location that is spaced apart from said third output encoding electrode by $T-1/f_c/8$, said fourth output encoding electrode having comb-like electrode pair groups corresponding to the same code series as that of said third output encoding electrode, wherein the number of pairs of electrodes in a comb-like electrode pair group of said output encoding electrodes corresponding to one code bit is greater than 1 and equal to or smaller than the ratio of said carrier frequency to a chip rate which is a frequency corresponding to an interval between the comb-like electrode pair groups of said output encoding electrodes.

25. A spread spectrum communication apparatus comprising:

a first surface acoustic wave element which includes,
a first piezoelectric substrate,
a first signal input encoding electrode formed on said first piezoelectric substrate,
a first output comb-like electrode formed on said first piezoelectric substrate at a location that is spaced apart from said first signal input encoding electrode by a predetermined interval, and
a second output comb-like electrode formed on said first piezoelectric substrate at a location that is spaced apart from said first output comb-like electrode by $T+(\pm n+a/8)/f_c$, T being one period of a signal to be received and demodulated, n being an integral number between 0 and a value twice as large as the ratio of a carrier frequency $f_c$ of a signal inputted to said first signal input encoding electrode to a chip rate which is a frequency corresponding to an interval between comb-like electrode pairs or groups of comb-like electrode pairs of said first signal input encoding electrode, said comb-like electrode pairs or groups of electrode pairs corresponding to a code series, and a satisfying $½ \leq a \leq 3/2$, a second surface acoustic wave element which includes,
a second piezoelectric substrate,
a second signal input encoding electrode formed on said second piezoelectric substrate, said second input electrode receiving said signal that is inputted to said first signal input encoding electrode,
a third output comb-like electrode formed on said second piezoelectric substrate at a location that is spaced apart from said second signal input encoding electrode, and
a fourth output comb-like electrode formed on said piezoelectric substrate at a located that is spaced apart from said third output comb-like electrode by $T+(\pm m-a/8)/f_c$, m being an integral number between 0 and a value twice as large as the ratio of said carrier frequency $f_c$ to said chip rate;

a first integrating circuit inputted with output signals of said first and second output comb-like electrodes of said first surface acoustic wave element; and a second integrating circuit inputted with output signals of said third and fourth output comb-like electrodes of said second surface acoustic wave element.

26. A spread spectrum communication apparatus according to claim 25, wherein at least one of n or m is not zero.

27. A spread spectrum communication apparatus according to claim 25, wherein n and m are not equal.

* * * * *